US012658857B2

(12) United States Patent　　(10) Patent No.:　US 12,658,857 B2
Jee et al.　　(45) Date of Patent:　Jun. 16, 2026

(54) POWER AMPLIFIER USING COUPLER AND ELECTRONIC DEVICE INCLUDING THE SAME

(71) Applicants:Samsung Electronics Co., Ltd., Suwon-si (KR); RESEARCH & BUSINESS FOUNDATION SUNGKYUNKWAN UNIVERSITY, Suwon-si (KR)

(72) Inventors: Seunghoon Jee, Suwon-si (KR); Youngoo Yang, Suwon-si (KR); Yifei Chen, Suwon-si (KR); Hyunuk Kang, Suwon-si (KR); Kyoungtae Kim, Suwon-si (KR); Youngyoon Woo, Suwon-si (KR); Jaekyung Shin, Suwon-si (KR); Woojin Choi, Suwon-si (KR)

(73) Assignees: Samsung Electronics Co., Ltd., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 490 days.

(21) Appl. No.: 18/304,050

(22) Filed: Apr. 20, 2023

(65) Prior Publication Data

US 2023/0261615 A1　　Aug. 17, 2023

Related U.S. Application Data

(63) Continuation of application No. PCT/KR2022/011319, filed on Aug. 1, 2022.

(30) Foreign Application Priority Data

Aug. 6, 2021　(KR) ........................ 10-2021-0103890

(51) Int. Cl.
*H03F 3/68*　　(2006.01)
*H03F 1/02*　　(2006.01)
(Continued)

(52) U.S. Cl.
CPC ........... *H03F 1/0288* (2013.01); *H03F 1/565* (2013.01); *H03F 3/24* (2013.01); *H03F 3/602* (2013.01);
(Continued)

(58) Field of Classification Search
CPC .......... H03F 1/0288; H03F 1/565; H03F 3/24; H03F 3/602; H03F 2200/198;
(Continued)

(56) References Cited

U.S. PATENT DOCUMENTS 6,853,245 B2　2/2005　Kim et al.
7,486,136 B2 *　2/2009　Bakalski ............... H03F 1/0288
330/51
(Continued)

FOREIGN PATENT DOCUMENTS

EP　　1609239 B1　7/2010
JP　2016-144015 A　8/2016
(Continued)

OTHER PUBLICATIONS

International Search Report dated Nov. 25, 2022, issued in International Patent Application No. PCT /KR2022/011319.
(Continued)

*Primary Examiner* — Khanh V Nguyen
(74) *Attorney, Agent, or Firm* — Jefferson IP Law, LLP

(57)　　ABSTRACT

The disclosure relates to a pre-5th-Generation (5G) or 5G communication system to be provided for supporting higher data rates Beyond 4th-Generation (4G) communication system such as Long-Term Evolution (LTE). A Doherty power amplifier of a wireless communication system is provided.
(Continued)

400

The Doherty power amplifier includes a first power amplifier, a second power amplifier, a first transmission line, a 4-port coupler, and a load impedance, and the 4-port coupler includes a first port, a second port, a third port, and a fourth port, the first power amplifier is coupled with the 4-port coupler through the first port, the second power amplifier is coupled with the 4-port coupler through the fourth port, the load impedance is coupled with the 4-port coupler through the third port, the first transmission line is disposed between the first power amplifier and the first port of the 4-port coupler, and the second port is an output end of the power amplifier.

18 Claims, 17 Drawing Sheets

(51) Int. Cl.

| | | |
|---|---|---|
| *H03F 1/56* | (2006.01) | |
| *H03F 3/24* | (2006.01) | |
| *H03F 3/60* | (2006.01) | |
| *H03F 3/21* | (2006.01) | |

(52) U.S. Cl.
CPC ........ *H03F 3/211* (2013.01); *H03F 2200/198* (2013.01); *H03F 2200/423* (2013.01); *H03F 2200/451* (2013.01)

(58) Field of Classification Search
CPC ......... H03F 2200/423; H03F 2200/451; H03F 2200/204; H03F 3/195; H03F 3/245; H03F 1/56; H03F 3/211; H03F 2200/255
USPC ............................................. 330/124 R, 295
See application file for complete search history.

(56) References Cited

U.S. PATENT DOCUMENTS

| | | | |
|---|---|---|---|
| 8,237,498 | B2 | 8/2012 | Kato et al. |
| 8,314,654 | B2 | 11/2012 | Outaleb et al. |
| 8,339,196 | B2 | 12/2012 | Hong et al. |
| 8,340,606 | B2 | 12/2012 | Park et al. |
| 8,810,312 | B2 | 8/2014 | Kim et al. |
| 9,614,479 | B2 | 4/2017 | Hallberg et al. |
| 9,887,671 | B2 | 2/2018 | Kobayashi et al. |
| 10,630,242 | B2 * | 4/2020 | McLaren ................ H03F 3/604 |
| 10,848,197 | B2 | 11/2020 | Pal et al. |
| 2004/0119533 | A1 | 6/2004 | Kwon et al. |
| 2004/0189381 | A1 * | 9/2004 | Louis ...................... H03F 3/602 330/124 R |
| 2014/0062589 | A1 | 3/2014 | Schenk |
| 2014/0159818 | A1 | 6/2014 | Jeon et al. |
| 2015/0070094 | A1 * | 3/2015 | Pham ...................... H03F 3/211 330/295 |
| 2015/0188504 | A1 | 7/2015 | Akesson et al. |
| 2016/0254792 | A1 | 9/2016 | Schenk et al. |
| 2022/0006428 | A1 * | 1/2022 | Shepphard ............ H03F 1/0266 |

FOREIGN PATENT DOCUMENTS

| | | |
|---|---|---|
| KR | 10-0450744 B1 | 10/2004 |
| KR | 10-2005-0116385 A | 12/2005 |
| KR | 10-0756041 B1 | 9/2007 |
| KR | 10-0840527 B1 | 6/2008 |
| KR | 10-2011-0068439 A | 6/2011 |
| KR | 10-2012-0079920 A | 7/2012 |
| KR | 10-2013-0038293 A | 4/2013 |
| KR | 10-1672797 B1 | 11/2016 |
| KR | 10-2018-0021890 A | 3/2018 |
| KR | 10-2021-0028841 A | 3/2021 |

OTHER PUBLICATIONS

Extended European Search Report dated Sep. 20, 2024, issued in European Application No. 22853398.0-1201.

Nikandish et al., Unbalanced Power Amplifier: An Architecture for Broadband Back-Off Efficiency Enhancement, IEEE Journal of Solid-State Circuits, vol. 56, No. 2, pp. 367-381, XP011834228, Aug. 21, 2020.

Lim et al., A Balanced Power Amplifier Utilizing the Reflected Input Power, 2009 IEEE International Symposium on Radio-Frequency Integration Technology, pp. 88-91, XP031640437, Jan. 9, 2009.

Korean Office Action dated Aug. 30, 2025, issued in Korean Patent Application No. 10-2021-0103890.

* cited by examiner

700

POWER AMPLIFIER USING COUPLER AND ELECTRONIC DEVICE INCLUDING THE SAME

CROSS-REFERENCE TO RELATED APPLICATION(S)

This application is a continuation application, claiming priority under § 365(c), of an International application No. PCT/KR2022/011319, filed on Aug. 1, 2022, which is based on and claims the benefit of a Korean patent application number 10-2021-0103890, filed on Aug. 6, 2021, in the Korean Intellectual Property Office, the disclosure of which is incorporated by reference herein in its entirety.

TECHNICAL FIELD

The disclosure relates to a wireless communication system. More particularly, the disclosure relates to a power amplifier using a coupler in a wireless communication system and an electronic device including the same.

BACKGROUND ART

To meet the demand for wireless data traffic having increased since deployment of $4^{th}$ generation (4G) communication systems, efforts have been made to develop an improved $5^{th}$ generation (5G) or pre-5G communication system. Therefore, the 5G or pre-5G communication system is also called a 'Beyond 4G Network' or a 'Post long-term evolution (LTE) System'.

The 5G communication system is considered to be implemented in higher frequency (millimeter (mm) Wave) bands, e.g., 60 gigahertz (GHz) bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid frequency shift keying (FSK) and frequency quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In the 5G system, an electronic device may use a modulation method having a high peak to average power ratio (PAPR) in order to process many data capacities. In order to linearly amplify a modulation signal having a high PAPR, a power amplifier operates in a back-off area where a power level is backed off from maximum output by a predetermined value, instead of in an area having a maximum output. In this case, efficiency of the power amplifier operating in the back-off area may be reduced, and power consumption may increase. In order to enlarge the back-off area, a Doherty power amplifier including two power amplifiers may be used. However, the Doherty power amplifier may have a limited back-off area and efficiency enhancement capability may be limited.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide a structure of a power amplifier which enlarges a back-off area by using a Doherty power amplifier including a coupler in a wireless communication system.

Another aspect of the disclosure is to provide a structure of a power amplifier which amplifies a signal having a high peak to average power ratio (PAPR) by using a power amplifier including a coupler in a wireless communication system.

Another aspect of the disclosure is to provide a structure of a power amplifier which minimizes power consumption and heat emission by using a power amplifier including a coupler in a wireless communication system.

Additional aspects will be set forth in part in the description which follows and, in part, will be apparent from the description, or may be learned by practice of the presented embodiments.

Technical Solution

In accordance with an aspect of the disclosure, a Doherty power amplifier of a wireless communication system is provided. The Doherty power amplifier includes a first power amplifier, a second power amplifier, a first transmission line, a 4-port coupler, and a load impedance, and the 4-port coupler may include a first port, a second port, a third port, and a fourth port, the first power amplifier may be coupled with the 4-port coupler through the first port, the second power amplifier may be coupled with the 4-port coupler through the fourth port, the load impedance may be coupled with the 4-port coupler through the third port, the first transmission line may be disposed between the first power amplifier and the first port of the 4-port coupler, and the second port may be an output end of the power amplifier.

In accordance with another aspect of the disclosure, an electronic device of a wireless communication system is provided. The electronic device includes at least one processor, a plurality of radio frequency (RF) chains connected with the at least one processor, and a plurality of antenna elements connected with the plurality of RF chains, and a first RF chain of the plurality of RF chains may include a Doherty power amplifier, the Doherty power amplifier may include a first power amplifier, a second power amplifier, a first transmission line, a 4-port coupler, and a load impedance, the 4-port coupler may include a first port, a second port, a third port, and a fourth port, the first power amplifier may be coupled with the 4-port coupler through the first port, the second power amplifier may be coupled with the 4-port coupler through the fourth port, the load impedance may be coupled with the 4-port coupler through the third port, the first transmission line may be disposed between the first power amplifier and the first port of the 4-port coupler, the second port may be an output end of the power amplifier.

Advantageous Effects

The apparatus according to various embodiments of the disclosure may enlarge a back-off area through a coupler connected with a power amplifier.

The apparatus according to various embodiments of the disclosure may linearly amplify a modulation signal having a high peak to average power ratio (PAPR) through a coupler connected with a power amplifier, and may enhance efficiency.

The apparatus according to various embodiments of the disclosure may minimize power consumption and heat emission through a coupler connected with a power amplifier.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following descriptions of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In various embodiments of the disclosure described below, hardware-wise approach methods will be described by way of an example. However, various embodiments of the disclosure include technology using both hardware and software, and thus do not exclude software-based approach methods.

The disclosure described hereinbelow relates to an apparatus and a method for enlarging a back-off area for power through a Doherty power amplifier including a coupler in a wireless communication system. Specifically, the disclosure relates to technology for enlarging a back-off area for power by applying an additional load to one end (e.g., a port) of a coupler.

As used herein, terms indicating components of the apparatus used in the following descriptions (line, transmission line, feeding line, matching network, power amplifier, Doherty power amplifier, carrier amplifier, peaking amplifier, phase offset, modulation impedance, coupler, combiner, stub), terms indicating a certain configuration of the components of the apparatus (port, terminal, end, input end, output end) are merely examples for convenience of explanation. Accordingly, the disclosure is not limited to the terms described below, and other terms having the same technical meanings may be used.

Figure 1:
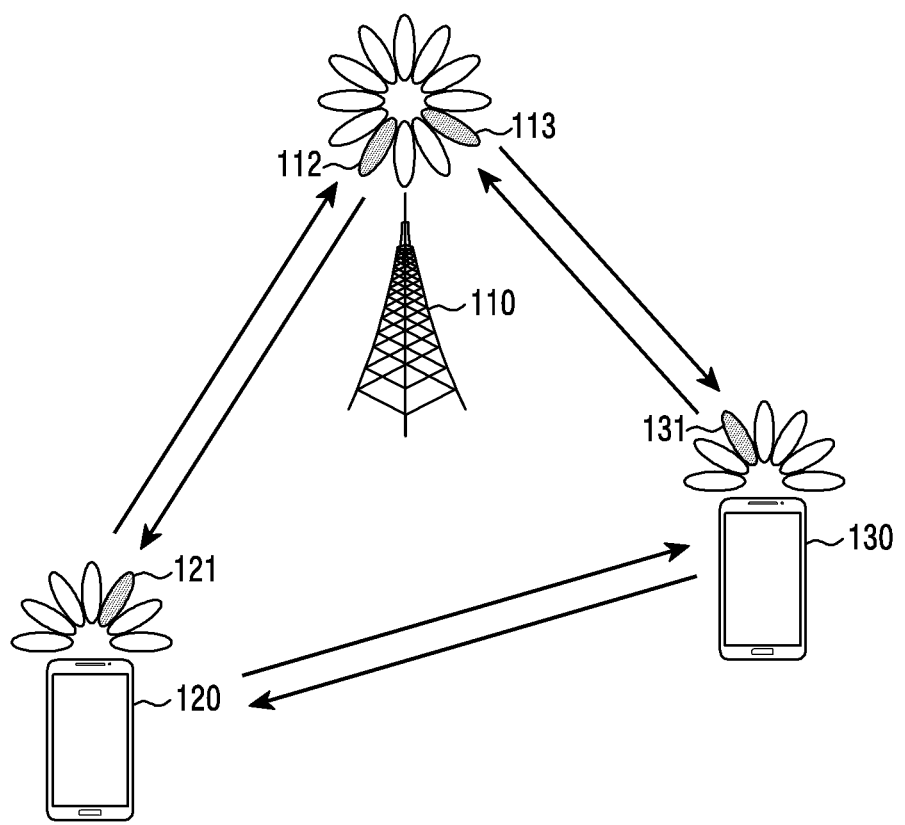
FIG. 1 is a view illustrating an example of a wireless communication environment according to an embodiment of the disclosure.

FIG. 1 illustrates a wireless communication system according to an embodiment of the disclosure. Referring to FIG. 1, it illustrates a base station 110, a terminal 120, and a terminal 130 as part of nodes using a wireless channel in a wireless communication system. FIG. 1 illustrates only one base station, but other base stations which are the same as or similar to the base station 110 may further be included.

The base station 110 is a network infrastructure that provides radio access to the terminals 120, 130. The base station 110 has a coverage that is defined as a predetermined geographical area based on a distance by which a signal can be transmitted. The base station 110 may be referred to as "access point (AP)," "eNodeB (eNB)," "5' generation (5G) node," "wireless point," "transmission/reception point (TRP)," or other terms having the same technical meaning as the above-mentioned terms, in addition to the base station.

Each of the terminal 120 and the terminal 130 is a device which is used by a user, and may communicate with the base station 110 through a wireless channel. According to circumstances, at least one of the terminals 120 and the terminal 130 may be operated without user's intervention. That is, at least one of the terminals 120 and the terminal 130 is a device which performs machine type communication (MTC), and may not be carried by a user. Each of the terminal 120 and the terminal 130 may be referred to as "user equipment (UE)," "mobile station," "subscriber station," "customer premises equipment (CPE)," "remote terminal," "wireless terminal," "electronic device," or "user device," or other terms having the same technical meaning as the above-mentioned terms, in addition to the terminal.

The base station 110, the terminal 120, the terminal 130 may transmit and receive wireless signals in millimeter wave (mmWave) bands (e.g., 28 GHz, 30 GHz, 38 GHz, 60 GHz). In this case, the base station 110, the terminal 120, the terminal 130 may perform beamforming to enhance a channel gain. Beamforming may include transmission beamforming and reception beamforming That is, the base station 110, the terminal 120, the terminal 130 may give directivity to a transmission signal or a reception signal. To achieve this, the base station 110 and the terminals 120, 130 may select serving beams 112, 113, 121, 131 through a beam search or beam management procedure. After the serving beams 112, 113, 121, 131 are selected, communication may be performed through resources that have a quasi co-located (QCL) relationship with resources which transmit the serving beams 112, 113, 121, 131.

The base station 110 or terminals 120, 130 may include an antenna array. Each antenna included in the antenna array may be referred to as an array element or an antenna element. The antenna array in the disclosure is illustrated as a two-dimensional planar array, but this is merely an example and other embodiments of the disclosure are not limited. The antenna array may be configured in various forms like a linear array or a multi-layer. The antenna array may be referred to as a massive antenna array. In addition, the antenna array may include a plurality of sub arrays including a plurality of antenna elements.

Figure 2A:
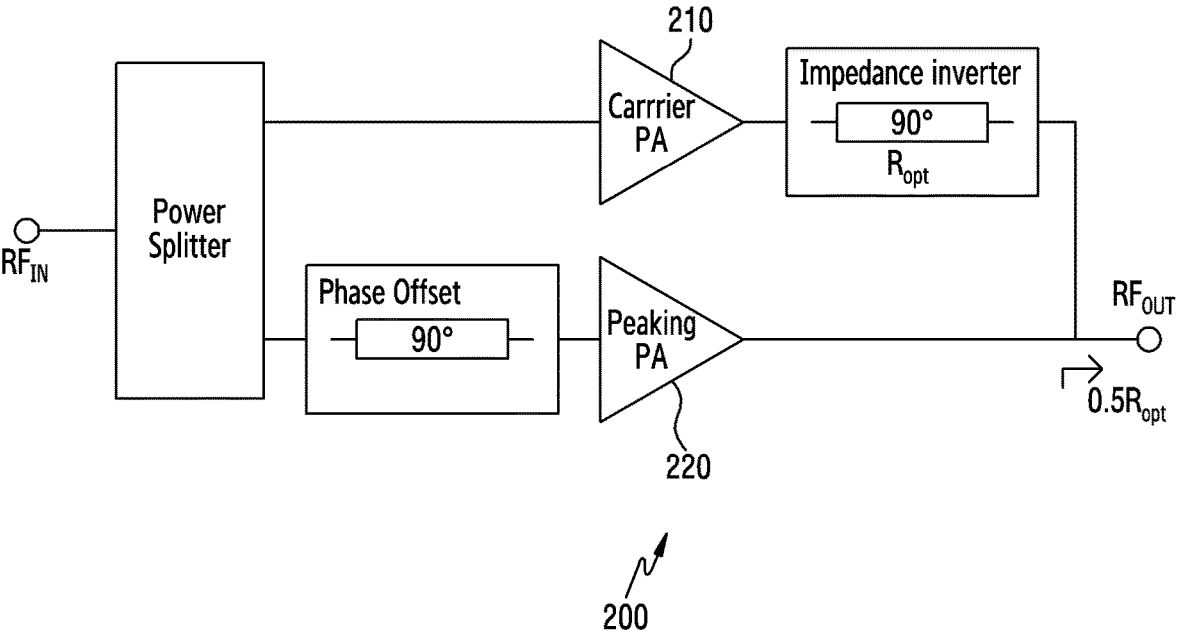
FIG. 2A is a view illustrating an example of a structure of a Doherty power amplifier according to an embodiment of the disclosure.

FIG. 2A illustrates an example of a structure of a Doherty power amplifier according to an embodiment of the disclosure.

Figure 2B:
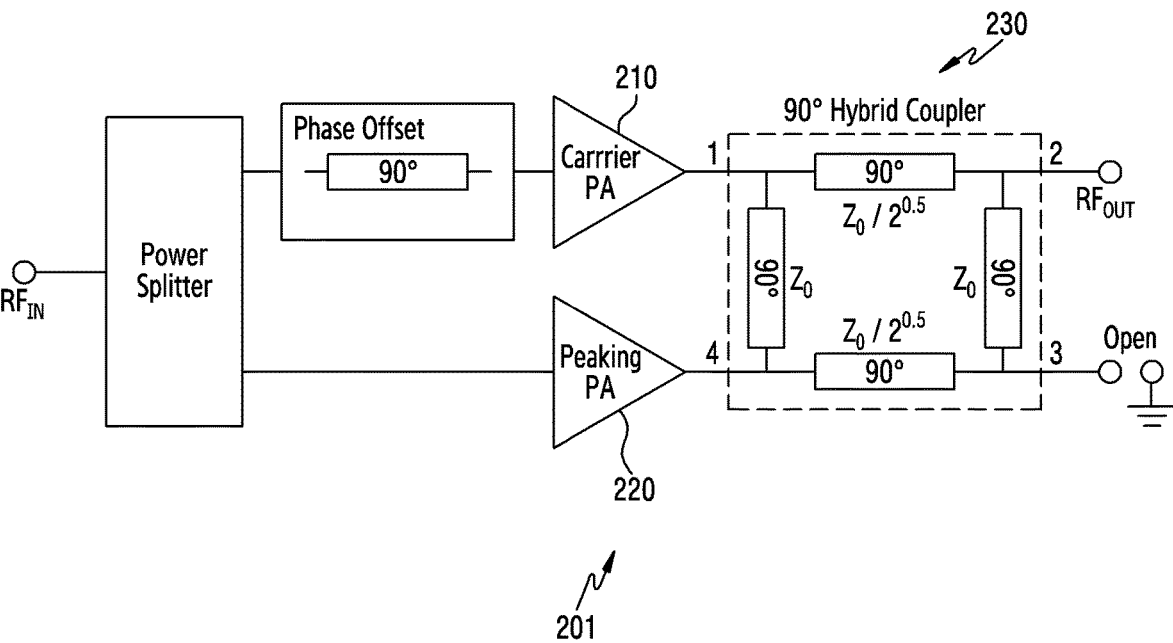
FIG. 2B is a view illustrating an example of a structure of a Doherty power amplifier including a coupler according to an embodiment of the disclosure.

FIG. 2B illustrates an example of a structure of a Doherty power amplifier including a coupler according to an embodiment of the disclosure.

Referring to FIG. 2A, the Doherty power amplifier (DPA) 200 may include a power splitter, a first power amplifier 210, a second power amplifier 220, an impedance inverter, and a phase offset. The Doherty power amplifier 200 may be configured to have the first power amplifier 210 and the second power amplifier coupled with each other. In this case, powers split through the power splitter may be inputted to the first power amplifier 210 and the second power amplifier 220, respectively. For example, the first power amplifier 210 may be configured by a Class-AB bias power amplifier, and the second power amplifier 220 may be configured by a Class-C bias power amplifier. An output end of the first power amplifier 210 may be coupled with the impedance inverter. The impedance inverter may refer to a configuration for modulating a load. For example, the impedance inverter may be a transmission line. In this case, the transmission line may have a characteristic impedance of $R_{opt}$ and an electrical length of 90°. In addition, in order to compensate for a phase change of a signal outputted from the first power amplifier 210 by the impedance inverter, an input end of the second power amplifier 220 may be coupled with the phase offset. The phase offset may refer to a configuration for converting a phase of a passing signal. For example, the phase offset may refer to a transmission line. In this case, the transmission line may have an electrical length of 90°.

Referring to FIG. 2B, a Doherty power amplifier 201 may further include a coupler 230 in addition to the components of the Doherty power amplifier 200 of FIG. 2A. The coupler 230 may be referred to as a 4-port coupler or a directional coupler. The first power amplifier 210 of the Doherty power amplifier 201 may be connected with a first port of the coupler 230, and the second power amplifier 220 may be connected with a fourth port of the coupler 230. In addition, an input end of the first power amplifier 210 may be connected with the phase offset which is a configuration for compensating for a phase value of a signal to be changed by the coupler 230. Herein, the phase offset may refer to a transmission line. The Doherty power amplifier 201 may output an inputted signal (e.g., an RF signal) through a second port of the coupler 230. In addition, a third port of the coupler 230 is opened, such that the Doherty power amplifier 201 may optimize load impedance modulation even without an impedance inverter, which is different form the Doherty power amplifier 200 of FIG. 2A.

In order to linearly amplify a signal, a related-art power amplifier (e.g., a Class-AB power amplifier) may be designed to operate in an area (hereinafter, a back-off area) where a power level is backed off from a maximum output power by a predetermined value, rather than in a maximum output power area. In this case, the predetermined value may be referred to as a back-off power, and the back-off power may be determined based on a peak to average power ratio (PAPR) value. However, the related-art power amplifier may have a narrow back-off area (e.g., about 6 dB or less), and, in order to overcome this limitation, the Doherty power amplifier 200 of FIG. 2A has been designed.

The Doherty power amplifier 200 may enhance efficiency in the back-off area through a method of modulating a load impedance of the amplifier by using the first power amplifier 210 and the second power amplifier 220. In this case, the first power amplifier 210 may be referred to as a main power amplifier (PA) or a carrier power amplifier (PA). The second power amplifier 220 may be referred to as a sub power amplifier (PA) or a peaking power amplifier (PA). The method of modulating the load impedance of the Doherty power amplifier 200 may be performed as follows. In an area of a high output power, the first power amplifier 210 and the second power amplifier 220 may output a power through a similar output, and in an area of a low output power, only the first power amplifier 210 may operate and the second power amplifier 220 may not operate. The load impedance may be modulated according to a level of an output power, and efficiency in the back-off area may be enhanced by the modulated impedance. The Doherty power amplifier 201 including the coupler may perform the same function through the above-described operation.

With the development of communication systems like $5^{th}$ generation (5G) or pre-5G in wireless communication systems, a modulation method for processing more data capacities may be applied. Such modulation methods may require a high PAPR. However, the Doherty power amplifier 200 and the Doherty power amplifier 201 may enhance efficiency only in a back-off area of about 6 dB, and accordingly, efficiency enhancement capability regarding modulation signals having a high PAPR may be limited. To solve this problem, the disclosure proposes a Doherty power amplifier (hereinafter, a Doherty power amplifier to which a modulation impedance is coupled) which is capable of adjusting a back-off area, by connecting an additional impedance (hereinafter, modulation impedance) element for modulating a load impedance to one of ports of a coupler. Prior to explaining the Doherty power amplifier to which the modulation impedance is coupled according to embodiments of the disclosure, comparison of performance between the Doherty power amplifier to which the modulation impedance is coupled according to the disclosure, and a related-art power amplifier (e.g., a Doherty power amplifier, Class-AB power amplifiers) will be described with reference to FIG. 2C.

Figure 2C:
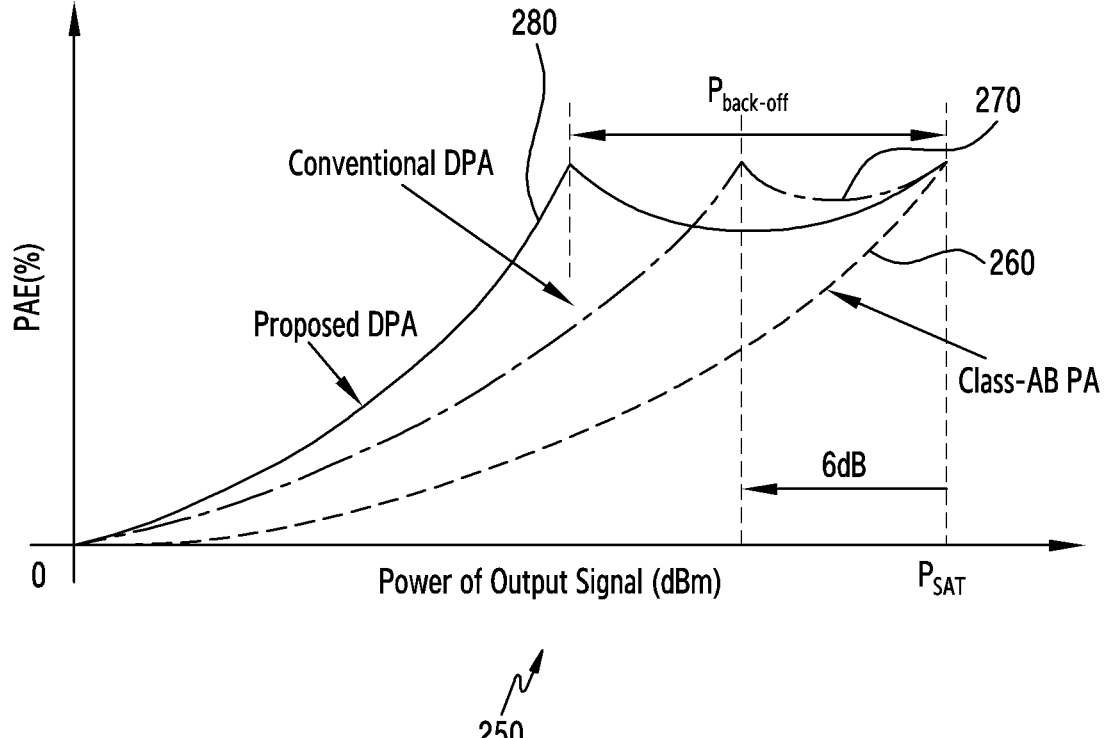
FIG. 2C is a graph illustrating examples of power added efficiency (PAE) of power amplifiers according to output signals according to an embodiment of the disclosure.

FIG. 2C is a graph illustrating examples of power added efficiency (PAE) of power amplifiers according to output signals according to embodiments of the disclosure. The PAE is a concept different from power efficiency and may refer to power efficiency considering only power generated in the power amplifier. For example, if a DC input power is 15 mW, a power supplied to the power amplifier is 1 mW, and a power outputted from the power amplifier is 10 mW, PAE may be calculated by 100*(10 mW-1 mW)/15 mW=60%.

Referring to FIG. 2C, the graph 250 illustrates a first line 260 showing PAE according to a power of an output signal of a Class-AB power amplifier, a second line 270 showing PAE according to a power of an output signal of a Doherty power amplifier (DPA), and a third line 280 showing PAE according to a power of an output signal of the Doherty power amplifier to which the modulation impedance is coupled according to the disclosure. The horizontal axis of the graph 250 may indicate power (unit: dBm) of an output signal, and the vertical axis may indicate PAE (unit: %).

Referring to the first line 260, it may have a maximum PAE value at a power $P_{SAT}$ of a time when the power of an output signal is saturated with a maximum output. However, the power is required to be backed off by a predetermined value by considering a PAPR in order to ensure linearity of the power amplifier. For example, PAE may be noticeably reduced in an area where the power is backed off from $P_{SAT}$ by about 6 dB.

Referring to the second line 270, it may have a maximum PAE value at $P_{SAT}$ like the first line 260. However, unlike the first line 260, the second line 270 may have a value similar to PAE at $P_{SAT}$ even in the area where the power is backed off by about 6 dB, and high efficiency may be obtained in the back-off area. However, in a back-off area where the power is backed off by about 6 dB or more, PAE of the second line 270 may be noticeably reduced. For example, in a back-off area by about 9 dB, PAE of the second line 270 may be lower than PAE in the back-off area by 6 dB. That is, a modulation signal using a high-order modulation method may increase a PAPR, and the related-art Doherty power amplifier (e.g., the Doherty power amplifier 200 of FIG. 2A or the Doherty power amplifier 201 of FIG. 2B) may not provide a back-off area (about 6 dB or more) sufficient to maintain linearity.

Referring to the third line 280, it may have a maximum PAE value at $P_{SAT}$ like the first line 260. In addition, even in the back-off area by about 6 dB or more, high efficiency having the same value as the PAE at $P_{SAT}$ may be achieved. Accordingly, the Doherty power amplifier to which the modulation impedance is coupled according to the disclosure (e.g., a Doherty power amplifier 400 of FIG. 4) may provide a back-off area (e.g., about 6 dB or more) to be able to maintain linearity with respect to a signal having a high PAPR according to use of a high-order modulation method. Hereinafter, the Doherty power amplifier to which the modulation impedance is coupled according to embodiments of the disclosure will be described in detail.

Figure 3:
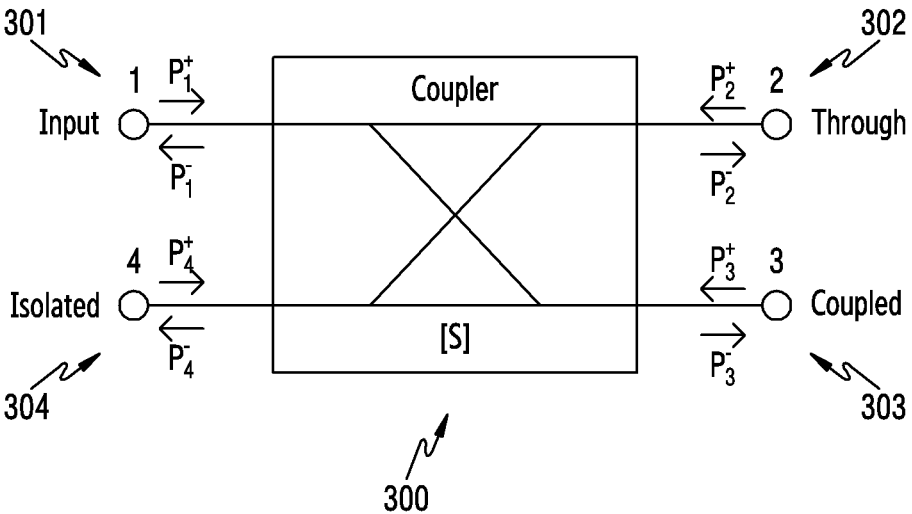
FIG. 3 is a view illustrating an example of a coupler according to an embodiment of the disclosure.

FIG. 3 illustrates an example of a coupler according to an embodiment of the disclosure. The coupler 300 of FIG. 3 may be referred to as a combiner or a divider. For example, the coupler 300 may refer to a 4-port coupler or a directional coupler.

Referring to FIG. 3, the coupler 300 may include four ports. For example, the coupler 300 may include a first port 301, a second port 302, a third port 303, and a fourth port 304. The first port 301 may be referred to as an input end (input). The first port 301 may refer to a terminal that is connected with output ends of RF components such as a power amplifier. The second port 302 may be referred to as an output end (through). The second port 302 may refer to a terminal that allows signals (e.g., RF signals) inputted from output ends of the RF components such as a power amplifier to pass through the coupler 300 and to be outputted therethrough. The third port 303 may be referred to as a coupled end or another output end. The third port 303 may refer to a terminal through which a part of a signal inputted to the first port 301 by using the coupler 300 is outputted. The fourth port 304 may be referred to as an isolated end. The fourth port 304 may refer to a terminal that is not actually used for an input and an output and is used for stabilizing power. However, positions of the respective ports of the coupler 300 are not limited to the positions of the ports 301 to 304 of the coupler 300 illustrated in FIG. 3, and may be determined according to positions of ports connected with output ends of other components (e.g., a power amplifier) connected with the coupler 300. In addition, in the disclosure, the port may be referred to as a term having similar or the same technical meanings as the terminal or end.

According to an embodiment, the third port 303 of the coupler 300 of FIG. 3 may have an isolation characteristic of not transmitting power. In order to explain the isolation characteristic of the third port 303, a scattering parameter (or S-parameter) matrix of the coupler 300 may be defined as shown in Equation 1 presented below:

9 10

$$[S] = \begin{bmatrix} 0 & \alpha & \beta e^{j\theta} & 0 \\ \alpha & 0 & 0 & \beta e^{j\theta} \\ \beta e^{j\theta} & 0 & 0 & \alpha \\ 0 & \beta e^{j\theta} & \alpha & 0 \end{bmatrix} \qquad \text{Equation 1}$$

where [S] may be a matrix regarding a scattering parameter of the coupler, a may be a first amplitude coefficient, β may be a second amplitude coefficient, e may be Euler's number or Napier's constant, j may be an imaginary unit, θ may be a phase coefficient. In this case, when there is no loss in the coupler 300, that is, a lossless coupler 300, a relationship between the first amplitude coefficient and the second amplitude coefficient may be expressed by $\alpha^2 + \beta^2 = 1$.

In addition, a power in a direction of being inputted to each port of the coupler 300 may be defined by Equation 2 presented below:

$$[P_{IN}] = \begin{bmatrix} P_1^+ \\ P_2^+ \\ P_3^+ \\ P_4^+ \end{bmatrix} \qquad \text{Equation 2}$$

where $[P_{IN}]$ may be a matrix regarding a power in a direction of being inputted to each port of the coupler, $$P_1^+$$

may be a power in a direction of being inputted to the first port of the coupler, $$P_2^+$$

may be a power in a direction of being inputted to the second port of the coupler, $$P_3^+$$

may be a power in a direction of being inputted to the third port of the coupler, $$P_4^+$$

may be a power in a direction of being inputted to the fourth port of the coupler.

In this case, a power in a direction of being outputted from each port of the coupler 300, that is, a reflected power $P_{REF}$, may be defined by the above-described equations, and $P_{REF}$ may be expressed by Equation 3 presented below:

$$[P_{REF}] = [S][P_{IN}] = \begin{bmatrix} P_1^- \\ P_2^- \\ P_3^- \\ P_4^- \end{bmatrix} \qquad \text{Equation 3}$$

where $[P_{REF}]$ may be a matrix regarding a power in a direction of being outputted from each port of the coupler or a matrix regarding a reflected power, [S] may be a matrix regarding a scattering coefficient of the coupler, $[P_{IN}]$ may be a matrix regarding a power in a direction of being inputted to each port of the coupler, $$P_1^-$$

may be a power in a direction of being outputted or reflected from the first port of the coupler, $$P_2^-$$

may be a power in a direction of being outputted or reflected from the second port of the coupler, $$P_3^-$$

may be a power in a direction of being outputted or reflected from the third port of the coupler, $$P_4^-$$

may be a power in a direction of being outputted or reflected from the fourth port of the coupler.

Relationships between respective values of the matrix $[P_{REF}]$ and values which are determined by calculation of the matrix [S] regarding the scattering parameter and the matrix $[P_{IN}]$ regarding the power in the direction of being inputted may be expressed by Equation 4 presented below:

$$\begin{aligned} P_1^- &= \alpha P_2^+ + \beta e^{j\theta} P_3^+ \\ P_2^- &= \alpha P_1^+ + \beta e^{j\theta} P_4^+ \\ P_3^- &= \alpha P_4^+ + \beta e^{j\theta} P_1^+ \\ P_4^- &= \alpha P_3^+ + \beta e^{j\theta} P_2^+ \end{aligned} \qquad \text{Equation 4}$$

where $$P_1^-$$

may be a power in a direction of being outputted or reflected from the first port of the coupler, $$P_2^-$$

may be a power in a direction of being outputted or reflected from the second port of the coupler, $$P_3^-$$

11 may be a power in a direction of being outputted or reflected from the third port of the coupler, $$P_4^-$$

may be a power in a direction of being outputted or reflected from the fourth port of the coupler, a is a first amplitude coefficient, β may be a second amplitude coefficient, e is Euler's number or Napier's constant, j may be an imaginary unit, θ may be a phase coefficient, $$P_1^+$$

may be a power in a direction of being inputted to the first port of the coupler, $$P_2^+$$

may be a power in a direction of being inputted to the second port of the coupler, $$P_3^+$$

may be a power in a direction of being inputted to the third port of the coupler, $$P_4^+$$

may be a power in a direction of being inputted to the fourth port of the coupler.

A power of each port which is defined by a power in a direction of being inputted and a power in a direction of being outputted (or a reflected power) may be defined as shown in Equation 5 presented below:

$$P_1 = |P_1^+|^2 - |P_1^-|^2 \qquad \text{Equation 5}$$
$$P_2 = |P_2^+|^2 - |P_2^-|^2$$
$$P_3 = |P_3^+|^2 - |P_3^-|^2$$
$$P_4 = |P_4^+|^2 - |P_4^-|^2$$

where $P_1$ may be a power of the first port of the coupler, $P_2$ may be a power of the second port of the coupler, $P_3$ may be a power of the third port of the coupler, $P_4$ may be a power of the fourth port of the coupler, $$P_1^-$$

may be a power in a direction of being outputted or reflected from the first port of the coupler,

12

$$P_2^-$$

may be a power in a direction of being outputted or reflected from the second port of the coupler, $$P_3^-$$

may be a power in a direction of being outputted or reflected from the third port of the coupler, $$P_4^-$$

may be a power in a direction of being outputted or reflected from the fourth port of the coupler, $$P_1^+$$

may be a power in a direction of being inputted to the first port of the coupler, $$P_2^+$$

may be a power in a direction of being inputted to the second port of the coupler, $$P_3^+$$

may be a power in a direction of being inputted to the third port of the coupler, $$P_4^+$$

may be a power in a direction of being inputted to the fourth port of the coupler.

In other words, the power at each port may refer to a value that is the square of an absolute value regarding a power in a direction of being inputted minus the square of an absolute value regarding a power in a direction of being outputted (a reflected power). The power at each port may be determined by considering directionality of a power inputted to or outputted from each port.

In this case, when there is no loss in the coupler 300 ($\alpha^2+\beta^2=1$) and a power in a direction of being inputted as shown in Equation 6 presented below is assumed, the power at each terminal may be calculated by Equation 7 presented below:

$$[P_{IN}] = \begin{bmatrix} \alpha\sqrt{P_0} \\ 0 \\ 0 \\ \beta\sqrt{P_0}\,e^{j\theta} \end{bmatrix} \qquad \text{Equation 6}$$

where $[P_{IN}]$ may be a matrix regarding a power in a direction of being inputted to each port of the coupler, a may be a first amplitude coefficient, $\beta$ may be a second amplitude coefficient, e may be Euler's number or Napier's constant, j may be an imaginary unit, $\theta$ may be a phase coefficient, $P_0$ may be a certain power value.

$$P_1 = \alpha^2 P_0 - 0$$

$$P_2 = 0 - P_0$$

$$P_3 = 0 - 0$$

$$P_4 = \beta^2 P_0 - 0 \qquad \text{Equation 7}$$

where $P_1$ may be a power of the first port of the coupler, $P_2$ may be a power of the second port of the coupler, $P_3$ may be a power of the third port of the coupler, $P_4$ may be a power of the fourth port of the coupler, a may be a first amplitude coefficient, $\beta$ may be a second amplitude coefficient, $P_0$ may be a certain power value, and $\alpha$ and $\beta$ may be values satisfying $\alpha^2 + \beta^2 = 1$.

Referring to the above-described equations, the power $(P_3)$ of the third port (i.e., the isolated end) of the coupler 300 may be 0. In other words, the third port 303 may show an isolation characteristic of not transmitting a power. Under the above-described condition, a load connected to the third port 303 may not influence a power distribution characteristic of a circuit even when a certain load is connected. For convenience of explanation, the Doherty power amplifier to which the modulation impedance is coupled according to embodiments of the disclosure will be described with reference to the above-described condition. However, embodiments of the disclosure are not limited to such a condition, and the disclosure may be interpreted as having the same technical meaning by adjusting values of components of the power amplifier even if there does not exist the above-described condition.

Figure 4:
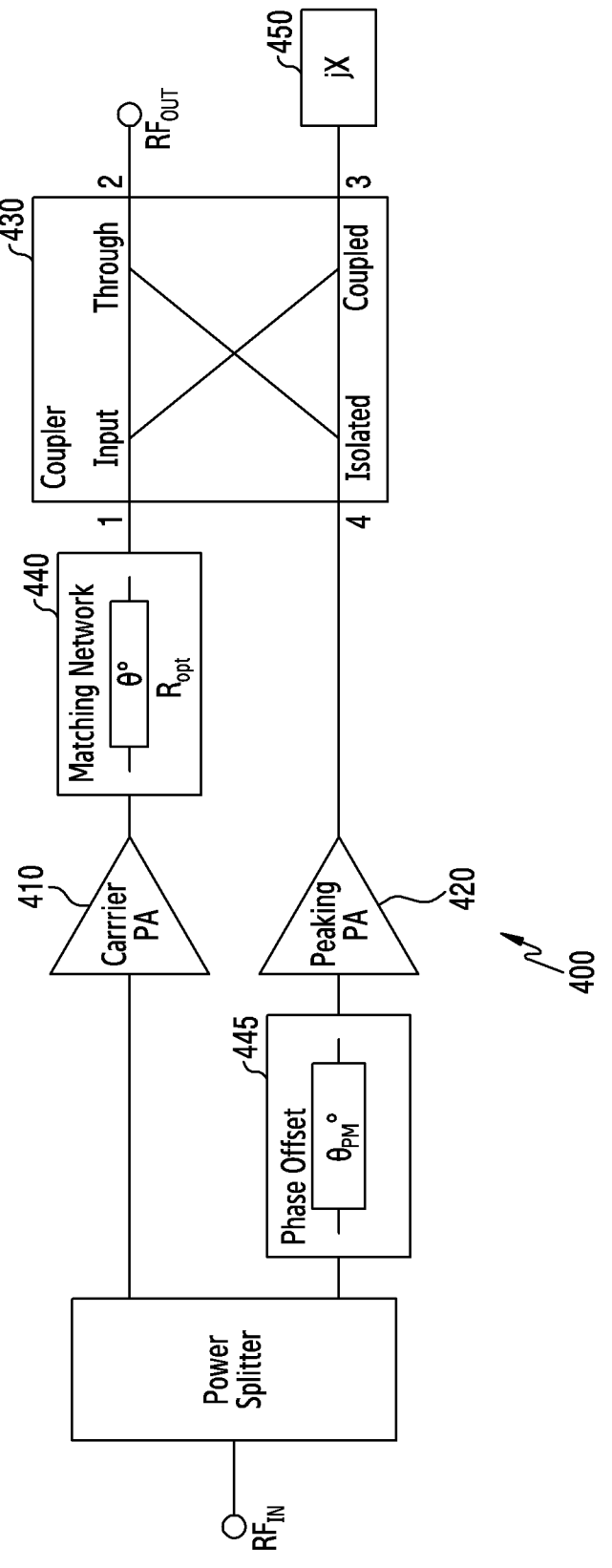
FIG. 4 is a view illustrating an example of a structure of a Doherty power amplifier including a coupler according to an embodiment of the disclosure.

FIG. 4 illustrates an example of a structure of a Doherty power amplifier including a coupler according to an embodiment of the disclosure.

Referring to FIG. 4, the Doherty power amplifier 400 may include a power splitter, a first power amplifier 410, a second power amplifier 420, a coupler 430, a matching network 440, a phase offset 445, and a modulation impedance 450. The first power amplifier 410 may be referred to as a main PA or a carrier PA. In addition, the second power amplifier 420 may be referred to as a sub PA or a peaking PA.

According to an embodiment, the first power amplifier 410 may amplify a power regarding a signal (e.g., an RF signal) which is split and is inputted from the power splitter. The first power amplifier 410 may transmit the amplified signal to the coupler 430 through the matching network 440. The second power amplifier 420 may receive a signal which results from compensation of a phase of a signal, which is split and inputted from the power splitter, by the phase offset 445. The second power amplifier 420 may amplify the power of the inputted signal and may transmit the amplified signal to the coupler 430. According to an embodiment, the first power amplifier 410 may be configured by a Class-AB power amplifier, and the second power amplifier 420 may be configured by a Class-C power amplifier.

According to an embodiment, the coupler 430 may be a 4-port coupler. The coupler 430 of FIG. 4 may be understood as being the same as the coupler 300 of FIG. 3. Accordingly, the descriptions of the coupler 300 of FIG. 3 may be equally applied to the coupler 430 of FIG. 4. The 4-port coupler may be referred to as a directional combiner or a directional coupler. The coupler 430 may receive a signal transmitted from the first power amplifier 410 or the second power amplifier 420, and may output a signal. In this case, an output of the coupler 430 may refer to an output of the Doherty power amplifier 400. In addition, the coupler 430 may be various couplers or an equivalent circuit formed by a lumped element as will be described in FIGS. 5 and 6. The structure of the coupler 430 will be described in detail below with reference to FIGS. 5 and 6.

According to an embodiment, the matching network 440 may refer to a configuration for load modulation. For example, the matching network 440 may be a transmission line. In the following descriptions, the matching network 440 may be referred to as a first transmission line. The matching network 440 may be configured to have characteristics of a specific condition for load modulation. In other words, the matching network 440 may be a transmission line (i.e., a first transmission line) which has a characteristic impedance of $R_{opt}$ and an electrical length of $\theta°$.

According to an embodiment, the phase offset 445 may refer to a configuration for compensating for a phase difference between the first power amplifier 410 and the second power amplifier 420. For example, the phase offset 445 may be a transmission line. In the following descriptions, the phase offset 445 may be referred to as a second transmission line. The phase offset 445 may be a transmission line (i.e., a second transmission line) which has an electrical length of $\theta_{PM}°$ to compensate for a phase difference.

According to an embodiment, the modulation impedance 450 may be a certain reactance element. For example, the modulation impedance 450 may be an element that has an impedance value of jX. Herein, j may be an imaginary unit and X may refer to a certain constant. The modulation impedance 450 may be a capacitor or an inductor which is a passive element having an impedance as will be described in FIG. 7, and may be an open stub or a short stub which substantially operates as a capacitor and an inductor in a high-frequency signal. A structure of the modulation impedance 450 will be described in detail with reference to FIG. 7.

According to an embodiment, the modulation impedance 450 may be connected with one of the ports of the coupler 430. For example, the modulation impedance 450 may be connected with the third port of the coupler 430. When the modulation impedance 450 is connected with the third port of the coupler 430, an impedance value of the modulation impedance 450 may be adjusted, and accordingly, an impedance in a direction toward the matching network 440 between the matching network 440 and the first power amplifier 410 (i.e., a load impedance of the amplifier) may be modulated. When the load impedance of the amplifier is modulated, a back-off area of the power amplifier (e.g., the Doherty power amplifier 400) may be enlarged, as will be described below. An operation of the Doherty power amplifier 400 according to addition of the modulation impedance 450 will be described in detail according to a state of a power amplifier in FIGS. 9A and 9B.

Referring to FIG. 4, the Doherty power amplifier 400 to which the modulation impedance is coupled according to embodiments of the disclosure may include the first power amplifier 410 and the second power amplifier 420, the coupler 430, the matching network 440 (the first transmission line), the phase offset 445 (the second transmission line), and the modulation impedance 450. In this case, the coupler 430 of the Doherty power amplifier 400 of FIG. 4 may not refer to a coupler having a specific structure, but refer to a certain coupler as shown in FIG. 4. In addition, the modulation impedance 450 of the Doherty power amplifier 400 of FIG. 4 may not refer to an impedance having a specific structure, but refer to a certain impedance. In this regard, various structures of the coupler and the modulation impedance will be described hereinbelow with reference to FIGS. 5 to 7.

Figure 5:
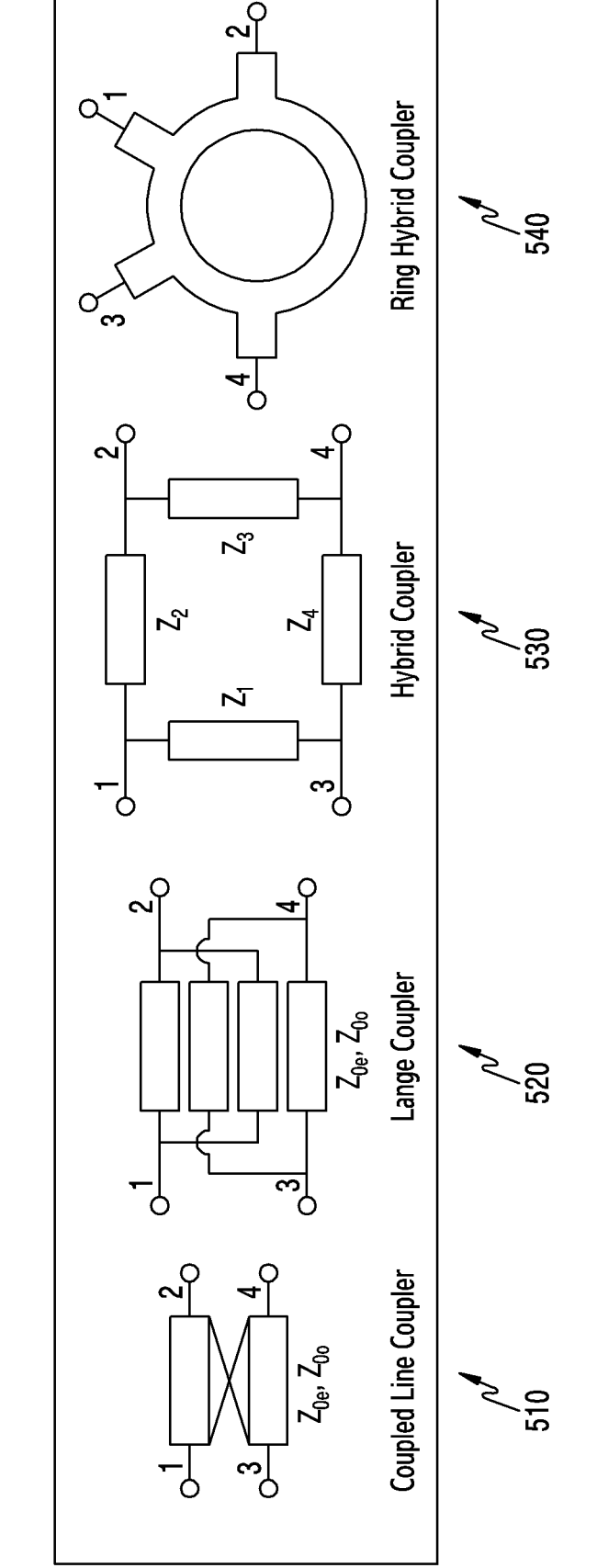
FIG. 5 is a view illustrating various examples of a coupler according to an embodiment of the disclosure.

FIG. 5 illustrates various examples of the coupler according to an embodiment of the disclosure. View 500 of FIG. 5 illustrates various couplers 510 to 540 regarding the coupler 430 of FIG. 4. However, the coupler of the Doherty power amplifier to which the modulation impedance is coupled according to embodiments of the disclosure should not be interpreted as being limited to the couplers shown in FIG. 5.

Referring to FIG. 5, view 500 illustrates a coupled line coupler 510, a lange coupler 520, a hybrid coupler 530, a ring hybrid coupler 540.

The coupled line coupler 510 may refer to a coupler which has two lines disposed adjacent to each other. In this case, an amount of coupling may be adjusted according to a gap and a length between the two lines disposed adjacent to each other. Respective ports (first to fourth ports) of the coupled line coupler 510 may be understood as being the same as the ports 301 to 304 of the coupler 300 of FIG. 3. In other words, a first port of the coupled line coupler 510 may refer to an input end, a second port may refer to an output end (through), a third port 303 may refer to a coupled end or another output end, and a fourth port 304 may refer to an isolated end.

The lange coupler 520 may refer to a coupler which is formed with bent lines. Accordingly, compared to other couplers, the lange coupler 520 may be formed to have a relatively small size. Respective ports (first to fourth ports) of the lange coupler 520 may be understood as being the same as the respective ports 301 to 304 of the coupler 300 of FIG. 3. In other words, a first port of the lange coupler 520 may refer to an input end, a second port may refer to an output end (through), a third port 303 may refer to a coupled end or another output end, and a fourth port 304 may refer to an isolated end.

The hybrid coupler 530 may refer to a coupler that is directly coupled through a branch line (e.g., $Z_1$ and $Z_3$) connecting lines arranged in parallel. Accordingly, the hybrid coupler 530 may be referred to as a branch line coupler. Respective ports (first to fourth ports) of the hybrid coupler 530 may be understood as being the same as the respective ports 301 to 304 of the coupler 300 of FIG. 3. In other words, a first port of the hybrid coupler 530 may refer to an input end, a second port may refer to an output end (through), a third port 303 may refer to a coupled end or another output end, and a fourth port 304 may refer to an isolated end.

The ring hybrid coupler 540 may refer to a coupler that has a circular line and four ports arranged therein. Respective ports (first to fourth ports) of the ring hybrid coupler 540 may be understood as being the same as the respective ports 301 to 304 of the coupler 300 of FIG. 3. In other words, a first port of the ring hybrid coupler 540 may refer to an input end, a second port may refer to an output end (through), a third port 303 may refer to a coupled end or another output end, and a fourth port 304 may refer to an isolated end.

Figure 6:
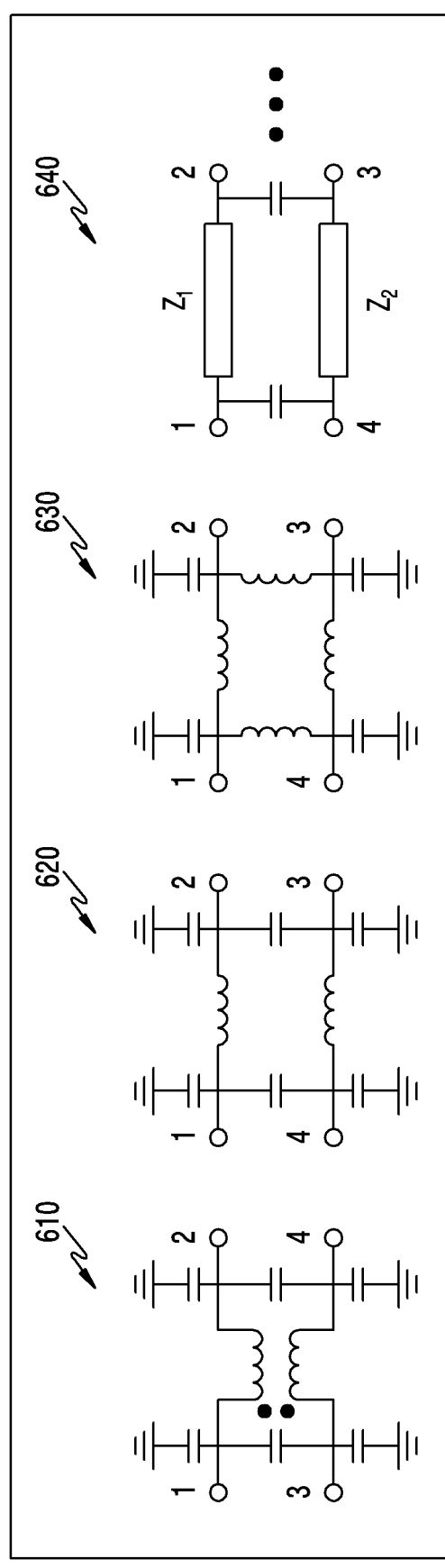
FIG. 6 is a view illustrating various examples of a circuit configured by a lumped element according to an embodiment of the disclosure.

FIG. 6 illustrates various examples of a circuit configured by a lumped element according to an embodiment of the disclosure. View 600 of FIG. 6 illustrates various equivalent circuits 610 to 640 which use a lumped element for the coupler 430 of FIG. 4. The circuits 610 to 640 may refer to a configuration that is electrically the same as the coupler 430 of FIG. 4. FIG. 6 illustrates various equivalent circuits

610 to 640, but the coupler of the Doherty power amplifier to which the modulation impedance is coupled according to various embodiments of the disclosure should not be interpreted as being limited to the circuits shown in FIG. 6.

Referring to FIG. 6, view 600 illustrates a first circuit 610, a second circuit 620, a third circuit 630, and a fourth circuit 640. Referring to the first circuit 610 to the third circuit 630, the circuit may configure a structure which is electrically the same as the coupler through a plurality of capacitors and a plurality of inductors. In addition, referring to the fourth circuit 640, the circuit may configure a structure that is electrically the same as the coupler through a plurality of capacitors and a plurality of transmission lines. In this case, respective ports (first port to fourth port) of the first circuit 610 to the fourth circuit 640 may be understood as being the same as the respective ports 301 to 304 of the coupler 300 of FIG. 3. In other words, a first port of the first circuit 610 to the fourth circuit 640 may refer to an input end, a second port may refer to an output end (through), a third port may refer to a coupled end or another output end, and a fourth port may refer to an isolated end.

Figure 7:
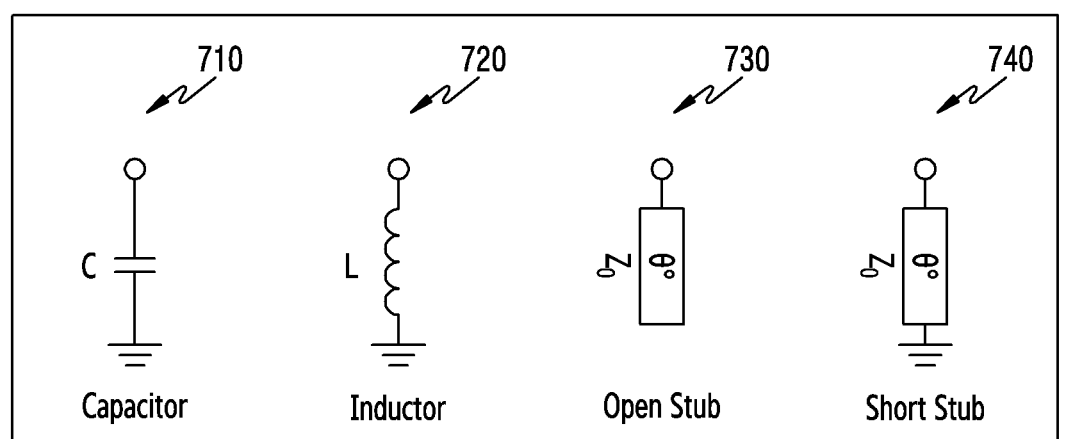
FIG. 7 is a view illustrating various examples of modulation impedances according to an embodiment of the disclosure.

FIG. 7 illustrates various examples of modulation impedances according to an embodiment of the disclosure. View 700 of FIG. 7 illustrates examples of the structure of the modulation impedance 450 of FIG. 4. FIG. 7 illustrates examples of the structure of the modulation impedance, but the modulation impedance of the Doherty power amplifier to which the modulation impedance is coupled according to embodiments of the disclosure should not be interpreted as being limited to the structures shown in FIG. 7.

Referring to FIG. 7, view 700 illustrates a capacitor 710, an inductor 720, an open stub 730, and a short stub 740. As will be described below with reference to FIGS. 9A and 9B, the modulation impedance may be configured by a lossless impedance element. That is, the modulation impedance may refer to reactance elements, not resistivity elements. According to an embodiment, the modulation impedance of the disclosure may include the capacitor 710 or the inductor 720. However, although FIG. 7 illustrates only the capacitor 710 or the inductor 720, the modulation impedance may be configured by a combination of the capacitor 710 and the inductor 720. According to an embodiment, the modulation impedance may include the open stub 730 or the short stub 740. When a frequency band is high like an RF signal, the stub may operate as a capacitor or an inductor. For example, the open stub 730 may operate as a capacitor in a high frequency. In addition, for example, the short stub 740 may operate as an inductor in a high frequency.

Figure 8:
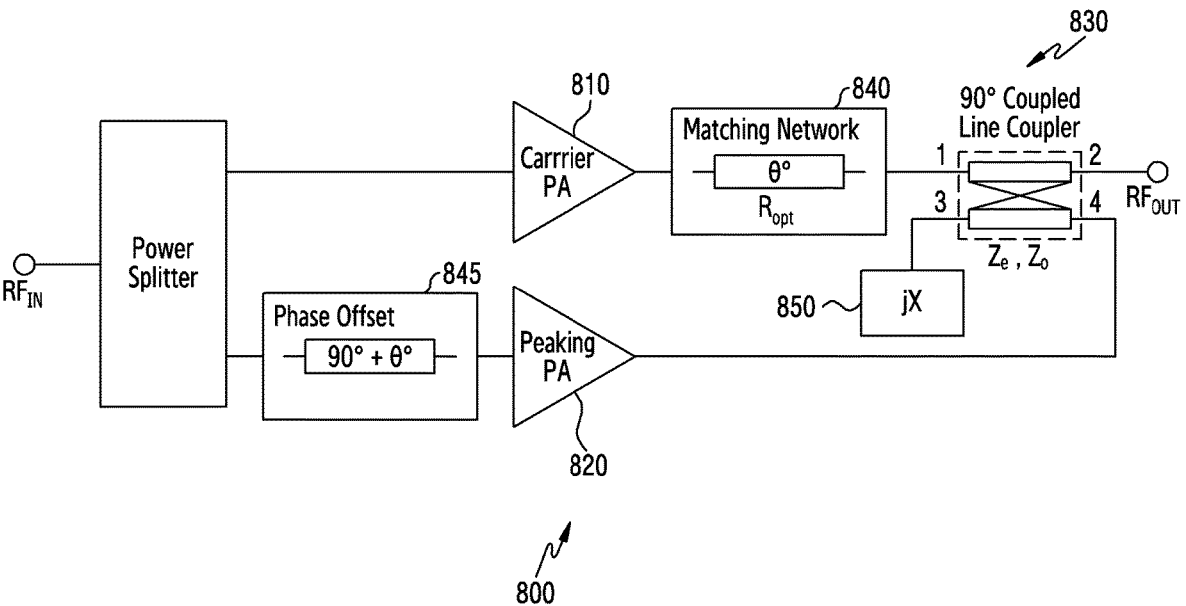
FIG. 8 is a view illustrating an example of a structure of a Doherty power amplifier including a 90° coupled line coupler according to an embodiment of the disclosure.

FIG. 8 illustrates an example of a structure of a Doherty power amplifier including a 90° coupled line coupler according to an embodiment of the disclosure. The 90° coupled line coupler of FIG. 8 may refer to an example of the coupled line coupler 510 of FIG. 5. That is, the 90° coupled line coupler may refer to a coupled line coupler 510 that has two lines arranged to overlap each other by a length of λ/4. Herein, λ may refer to a wavelength of a signal passing through the coupled line coupler 510. The Doherty power amplifier 800 including the 90° coupled line coupler of FIG. 8 is merely an example for convenience of explanation, and the disclosure is not limited thereto. For example, the Doherty power amplifier to which the modulation impedance is coupled according to embodiments of the disclosure may include the structures of other couplers of FIG. 5 or a circuit having a structure which is electrically the same as or the coupler of FIG. 6.

Referring to FIG. 8, the Doherty power amplifier 800 may include a power splitter, a first power amplifier 810, a second power amplifier 820, the 90° coupled line coupler 830, a matching network 840, a phase offset 845, and a modulation impedance 850. The Doherty power amplifier 800 may be understood as being the same as the Doherty power amplifier 400 of FIG. 4. In other words, the descriptions of the Doherty power amplifier 400 may be equally applied to the Doherty power amplifier 800.

According to an embodiment, the first power amplifier 810 may amplify a power regarding a signal (e.g., an RF signal) which is split and inputted from by the power splitter. The first power amplifier 810 may transmit the amplified signal to the line coupler 830 through the matching network 840. The second power amplifier 820 may receive a signal resulting from compensation of a phase of a signal, which is split and inputted from the power splitter, through the phase offset 845. The second power amplifier 820 may amplify a power of the inputted signal and may transmit the signal to the 90° coupled line coupler 830. According to an embodiment, the first power amplifier 810 may be configured by a Class-AB power amplifier, and the second power amplifier 820 may be configured by a Class-C power amplifier. In the following descriptions, the first power amplifier 810 may be referred to as a main PA or a carrier PA. In addition, the second power amplifier 820 may be referred to as a sub PA or a peaking PA.

According to an embodiment, the 90° coupled line coupler 830 may be a 4-port coupler. Herein, the 4-port coupler may be referred to as a directional combiner or a directional coupler. The 90° coupled line coupler 830 may receive a signal transmitted from the first power amplifier 810 or the second power amplifier 820, and may output the received signal. In this case, an output of the 90° coupled line coupler 830 may refer to an output of the Doherty power amplifier 800.

According to another embodiment, the matching network 840 may refer to a configuration for load modulation. For example, the matching network 840 may be a transmission line. In the following descriptions, the matching network 840 may be referred to as a first transmission line. The matching network 840 may be configured to have characteristics of a specific condition for load modulation. In other words, the matching network 840 may be a transmission line (i.e., a first transmission line) that has a characteristic impedance of $R_{opt}$ and an electrical length of $\theta°$.

According to an embodiment, the phase offset 845 may refer to a configuration for compensating for a phase difference between the first power amplifier 810 and the second power amplifier 820. For example, the phase offset 845 may be a transmission line. In the following descriptions, the phase offset 845 may be referred to as a second transmission line. The phase offset 845 may be a transmission line (i.e., a second transmission line) that has an electrical length of $\theta°+90°$ to compensate for a phase difference. The electrical length of the phase offset 445 of FIG. 8 is a value of the electrical length of the phase offset 445 of FIG. 4, and, by exactly compensating for a phase difference by the 90° coupled line coupler 830, load impedance modulation of the disclosure may be more effectively performed.

According to an embodiment, the modulation impedance 850 may be a certain reactance element. For example, the modulation impedance 850 may be an element that has an impedance value of jX. Herein, j may be an imaginary unit and X may be a certain constant. The modulation impedance 850 may be a capacitor or an inductor which is a passive element having an impedance as described in FIG. 7, and may be an open stub or a short stub operating substantially as a capacitor and an inductor in a high frequency signal.

According to an embodiment, the modulation impedance 850 may be connected with one of the ports of the 90° coupled line coupler 830. For example, the modulation impedance 850 may be connected with the third port of the 90° coupled line coupler 830. When the modulation impedance 850 is connected with the third port of the 90° coupled line coupler 830, an impedance value of the modulation impedance 850 may be adjusted, and accordingly, an impedance in a direction toward the matching network 840 between the matching network 840 and the first power amplifier 810 (i.e., a load impedance of the amplifier) may be modulated. When the load impedance of the amplifier is modulated, a back-off area of the power amplifier (e.g., the Doherty power amplifier 800) may be enlarged as will be described below. An operation of the Doherty power amplifier 800 according to addition of the modulation impedance 850 will be described in detail according to a state of the power amplifier of FIGS. 9A and 9B.

Figure 9A:
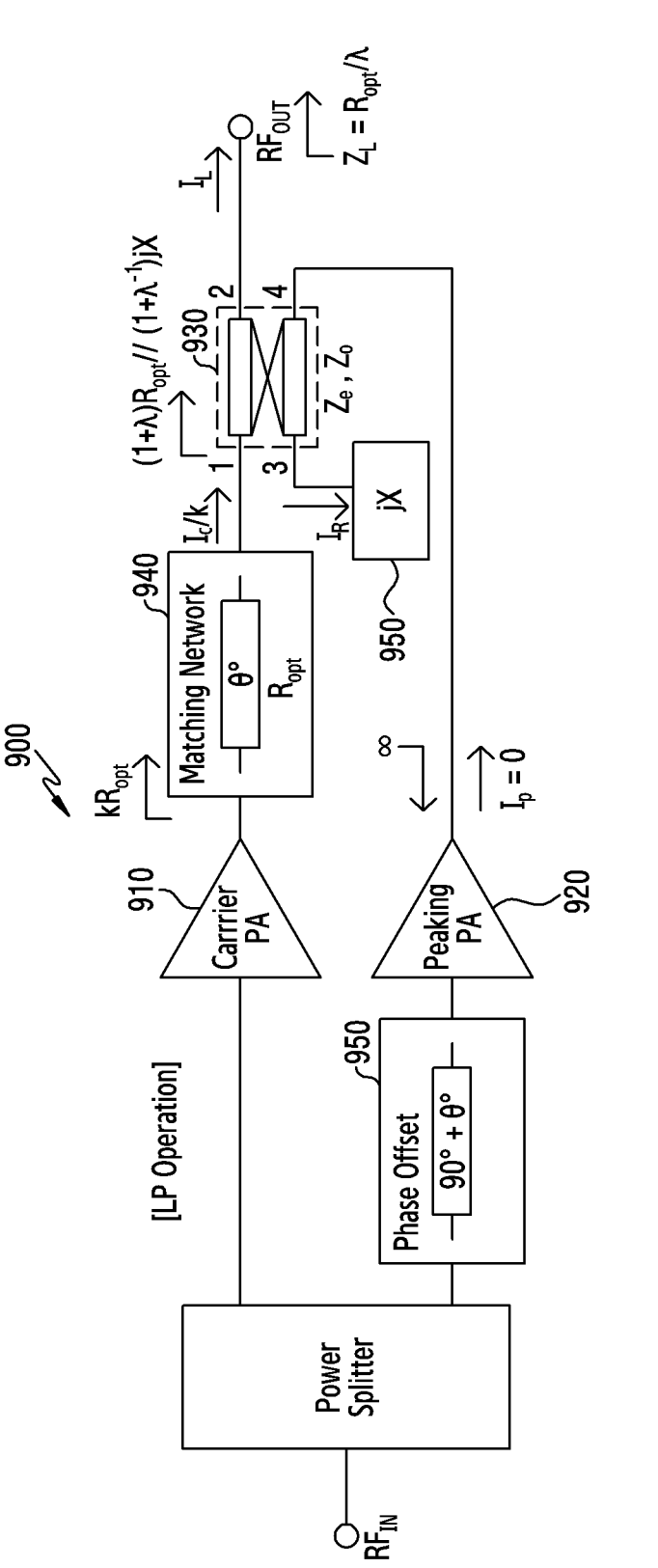
FIG. 9A is a view illustrating an example of an operation in a first state of a Doherty power amplifier including a 90° coupled line coupler according to an embodiment of the disclosure.
Figure 9B:
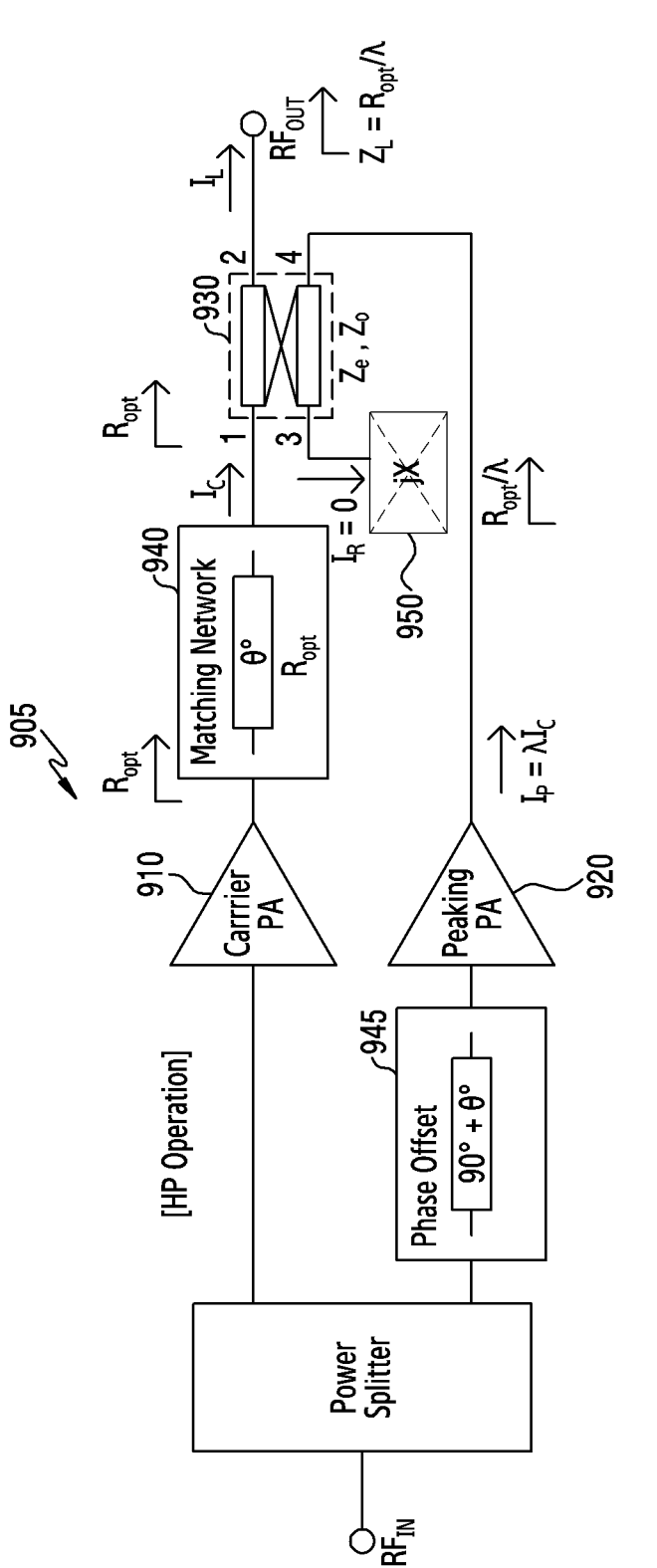
FIG. 9B is a view illustrating an example of an operation in a second state of the Doherty power amplifier including the 90° coupled line coupler according to an embodiment of the disclosure.

FIG. 9A illustrates an example of an operation in a first state of a Doherty power amplifier including a 90° coupled line coupler according to an embodiment of the disclosure. FIG. 9B illustrates an example of an operation in a second state of a Doherty power amplifier including a 90° coupled line coupler according to an embodiment of the disclosure.

The Doherty power amplifier 900 of FIG. 9A and the Doherty power amplifier 905 of FIG. 9B may be understood as being the same as the Doherty power amplifier 800 of FIG. 8. Accordingly, structures of the Doherty power amplifier 900 and the Doherty power amplifier 905 may be understood as being the same as that of the Doherty power amplifier 800 of FIG. 8. Hereinafter, an operating process of the Doherty power amplifier 900 in the first state and the Doherty power amplifier 905 in the second state will be described, and the same contents as those described in FIG. 8 will not be described. Herein, the first state may refer to a low power (LP) state and the second state may refer to a high power (HP) state. The low power and the high power may be determined relatively with reference to a maximum output power.

Referring to FIG. 9A, the Doherty power amplifier 900 may include a power splitter, a first power amplifier 910, a second power amplifier 920, a 90° coupled line coupler 930, a matching network 940 (i.e., a first transmission line), a phase offset 945 (i.e., a second transmission line), and a modulation impedance 950.

According to an embodiment, in the first state (i.e., in the LP state), the second power amplifier 920 of the Doherty power amplifier 900 may be controlled not to operate. When the second power amplifier 920 does not operate, an impedance viewed from an output end of the second power amplifier 920 may be infinite (∞). In this case, the 90° coupled line coupler 930 may substantially operate as a 2-port filter.

According to an embodiment, an impedance $Z_1$ viewed from a first port (i.e., an input end) of the 90° coupled line coupler 930 may be defined as a function of the modulation impedance 950. In order to define an equation regarding the impedance $Z_1$ viewed from the first port, a Z parameter (impedance matrix) regarding the 90° coupled line coupler 930 may be expressed by Equation 8 presented below:

$$-\frac{j}{2}\begin{bmatrix} 0 & 0 & Z_e - Z_o & Z_e + Z_o \\ 0 & 0 & Z_e + Z_o & Z_e - Z_o \\ Z_e - Z_o & Z_e + Z_o & 0 & 0 \\ Z_e + Z_o & Z_e - Z_o & 0 & 0 \end{bmatrix}\begin{bmatrix} I_C/k \\ -I_R \\ 0 \\ -I_L \end{bmatrix} = \begin{bmatrix} Z_1 I_C/k \\ jX I_R \\ V_P \\ Z_L I_L \end{bmatrix} \quad \text{Equation 8}$$

19 where $Z_e$ may be an impedance in an even mode of the 90° coupled line coupler, $Z_o$ may be an impedance in an odd-mode of the 90° coupled line coupler, may be a current inputted to the first port of the 90° coupled line coupler, k may be a constant indicating a modulation factor of an impedance, $Z_1$ may be an impedance viewed from the first port of the 90° coupled line coupler, $I_R$ may be a current outputted from the third port of the 90° coupled line coupler, j may be an imaginary unit, X may be a reactance of the modulation impedance, $V_P$ may be a voltage of the fourth port of the 90° coupled line coupler, $I_L$ may be a current outputted from the second port of the 90° coupled line coupler, $Z_L$ may be an impedance viewed from the second port of the 90° coupled line coupler or a load impedance of the Doherty power amplifier.

In order to define an equation regarding the impedance $Z_1$ viewed from the first port, a terminal matching load impedance $Z_0$ and a coupling coefficient C of the 90° coupled line coupler may be arranged with respect to $Z_e$ and $Z_o$ as in Equation 9 presented below:

$$Z_0 = \sqrt{Z_e Z_o}, \ C = \frac{Z_e - Z_o}{Z_e + Z_o} \qquad \text{Equation 9}$$

where $Z_0$ may be a terminal matching load impedance of the 90° coupled line coupler, $Z_e$ may be an impedance in an even mode of the 90° coupled line coupler, $Z_o$ may be an impedance in an odd-mode of the 90° coupled line coupler, C may be a coupling coefficient of the 90° coupled line coupler. In this case, $Z_0$ may refer to an impedance of each port when reflection does not occur at all ports of the coupler.

If the above-described equation is rearranged, the impedance $Z_1$ viewed from the first port may be rearranged by an equation regarding $Z_0$, C, $Z_L$, and X as shown in Equation 10 presented below:

$$Z_1 = \frac{Z_0^2}{(1 - C^2)Z_L} \ \| \ \frac{jX}{C^2} \qquad \text{Equation 10}$$

where $Z_1$ may be an impedance viewed from the first port of the 90° coupled line coupler, $Z_0$ may be a terminal matching load impedance of the 90° coupled line coupler, C may be a coupling coefficient of the 90° coupled line coupler, X may be a reactance of the modulation impedance, and $Z_L$ may be an impedance viewed from the second port of the 90° coupled line coupler or a load impedance of the Doherty power amplifier.

Accordingly, the impedance $Z_1$ viewed from the first port may be determined based on a reactance value of the modulation impedance 950. In this case, a relationship between an input end and an output end of the matching network 940 may be determined by the transmission line theory, and an impedance $$Z_1^*$$

viewed from the output end of the first power amplifier 910 may be defined by Equation 11 presented below:

20

$$Z_1^* = R_{opt} \frac{1 + jk\tan(\theta°)}{k + j\tan(\theta°)} \qquad \text{Equation 11}$$

where $$Z_1^*$$

may be an impedance viewed from the output end of the first power amplifier, $R_{opt}$ may be a characteristic impedance of a matching network (first transmission line), $\theta°$ may be an electrical length of the matching network (first transmission line), j may be an imaginary unit, and k may be a constant indicating a modulation factor of the impedance.

Referring to FIG. 9B, according to an embodiment, in the second state (i.e., the HP state), the second power amplifier 920 of the Doherty power amplifier 905 may operate unlike in the first state. In this case, a level ratio between an output current of the first power amplifier 910 of the Doherty power amplifier 905 and an output current of the second power amplifier 920 of the Doherty power amplifier 905 may be defined as 1:λ. Herein, may refer to a ratio of a level of a current at the output end of the second power amplifier 920 to a current at the output end of the first power amplifier 910. For example, in the case of a symmetric Doherty power amplifier, may be 1. In addition, for example, in the case of an asymmetric Doherty power amplifier, may be smaller than 1 or larger than 1.

When an incident power condition as in Equation 6 described in FIG. 3 is satisfied, the modulation impedance 950 of the Doherty power amplifier 905 may be connected to the third port of the isolated state. Accordingly, the modulation impedance 950 may not influence a load impedance viewed from the output end of the first power amplifier 910. In order to define the load impedance $Z_L$ of the Doherty power amplifier, the terminal matching load impedance $Z_0$ of the 90° coupled line coupler, and the coupling coefficient C of the 90° coupled line coupler in the second state, a Z parameter (impedance matrix) regarding the 90° coupled line coupler 930 of the Doherty power amplifier 905 may be expressed by Equation 12 presented below:

$$\frac{-j}{2} \begin{bmatrix} 0 & 0 & Z_e - Z_o & Z_e + Z_o \\ 0 & 0 & Z_e + Z_o & Z_e - Z_o \\ Z_e - Z_o & Z_e + Z_o & 0 & 0 \\ Z_e + Z_o & Z_e - Z_o & 0 & 0 \end{bmatrix} \begin{bmatrix} I_c \\ 0 \\ -j\lambda I_c \\ -I_L \end{bmatrix} = \qquad \text{Equation 12}$$

$$\begin{bmatrix} R_{opt}I_C \\ 0 \\ -jR_{opt}I_C \\ Z_L I_L \end{bmatrix}$$

where $Z_e$ may be an impedance in an even mode of the 90° coupled line coupler, $Z_o$ may be an impedance in an odd-mode of the 90° coupled line coupler, $I_C$ may be a current inputted to the first port of the 90° coupled line coupler, $R_{opt}$ may be a characteristic impedance of the matching network (first transmission line), may be a ratio of a level of a current at the output end of the second power amplifier to a current at the output end of the first power amplifier, j may be an imaginary unit, $I_L$ may be a current outputted from the second port of the 90° coupled line coupler, $Z_L$ may be an impedance viewed from the second port of the 90° coupled line coupler or a load impedance of the Doherty power amplifier.

If the matrix regarding the Z parameter in the second state described above is solved, the load impedance $Z_L$ of the Doherty power amplifier, the terminal matching load impedance $Z_0$ of the 90° coupled line coupler and the coupling coefficient C of the 90° coupled line coupler may be defined as shown in Equation 13 presented below:

$$Z_L = \frac{R_{opt}}{\lambda}, Z_0 = \frac{R_{opt}}{\sqrt{\lambda}}, C = \frac{\sqrt{\lambda}}{\sqrt{\lambda+1}} \qquad \text{Equation 13}$$

where $R_{opt}$ may be a characteristic impedance of the matching network (first transmission line), $\lambda$ may be a ratio of a level of a current at the output end of the second power amplifier to a current at the output end of the first power amplifier, and $Z_L$ may be an impedance viewed from the second port of the 90° coupled line coupler or a load impedance of the Doherty power amplifier.

Referring to the above-described equations, a tangent value $\tan(\theta°)$ regarding the electrical length of the matching network and a reactance value $jX$ of the modulation impedance may be rearranged as shown in Equation 14 presented below:

$$jX = jR_{opt}\frac{\lambda k}{((\lambda+1)k-1)\tan(\theta°)}$$ 
$$\tan(\theta°) = \frac{\sqrt{k(k-\lambda-1)}}{\sqrt{(\lambda+1)k-1}} \qquad \text{Equation 14}$$

where j may be an imaginary unit, X may be a reactance of the modulation impedance, may be a ratio of a level of a current at the output end of the second power amplifier to a current at the output end of the first power amplifier, k may be a constant indicating a modulation factor of the impedance, $\theta°$ may be an electrical length of the matching network (first transmission line), and $R_{opt}$ may be a characteristic impedance of the matching network (first transmission line).

$R_{opt}$ may refer to a load impedance causing the first power amplifier to have a maximum output power. Accordingly, $R_{opt}$ may be a value that is determined according to performance and a type of an amplifier. Accordingly, in the above-described equation, $R_{opt}$ may be a fixed value. Accordingly, may be determined based on a reactance value $jX$ of a designed modulation impedance and a tangent value) $\tan(\theta°)$ regarding an electrical length of a designed matching network. In addition, k may be determined based on the reactance value $jX$ of the designed modulation impedance and the tangent value $\tan(\theta°)$ regarding the electrical length of the designed matching network.

If the above-described equations are rearranged, a back-off power ($P_{backoff}$) may be expressed by an equation regarding k and as shown in Equation 15 presented below. The back-off power may refer to a difference value between powers of an area where a power level is backed off from a maximum output power (i.e., a back-off area).

$$P_{backoff}(\text{dB}) = 10 \log k + 10 \log(\lambda+1) \qquad \text{Equation 15}$$

where $P_{backoff}$ may be a power indicating a range where a power level is backed off in the Doherty power amplifier, $\lambda$ may be a ratio of a level of a current at the output end of the second power amplifier to a current at the output end of the first power amplifier, and k may be a constant indicating a modulation ratio of the impedance.

To summarize, the back-off power $P_{backoff}$ of the Doherty power amplifier to which the modulation impedance is coupled according to embodiments of the disclosure may be determined by the modulation factor (k) of the impedance viewed from the output end of the first power amplifier of the Doherty power amplifier, and the ratio $\lambda$ of the current level between the first power amplifier and the second power amplifier. k and $\lambda$ may be determined based on a reactance of the modulation impedance and the matching network, and the back-off power $P_{backoff}$ may be adjusted according to the reactance value of the modulation impedance and characteristics (a characteristic impedance and an electrical length) of the matching network.

Referring to the above descriptions, a value of the modulation impedance $$Z_1^*$$

viewed from the output end of the first power amplifier may be determined by the modulation factor (k) of the impedance viewed from the output end of the first power amplifier. For example, referring to the equation regarding $$Z_1^*,$$

as the tangent value regarding the electrical length of the transmission line is larger, $$Z_1^*$$

may be more approximate to $kR_{opt}$. In addition, the back-off power may be determined by the modulation factor (k) of the impedance viewed from the output end of the first power amplifier. Hereinafter, a load impedance viewed from the output end of the first power amplifier and a back-off power according to a modulation factor (k) of an impedance viewed from the output end of the first power amplifier when the Doherty power amplifier to which the modulation impedance is coupled according to embodiments of the disclosure is symmetric (i.e., $\lambda=1$) will be described with reference to FIGS. 10A to 11.

Figure 10A:
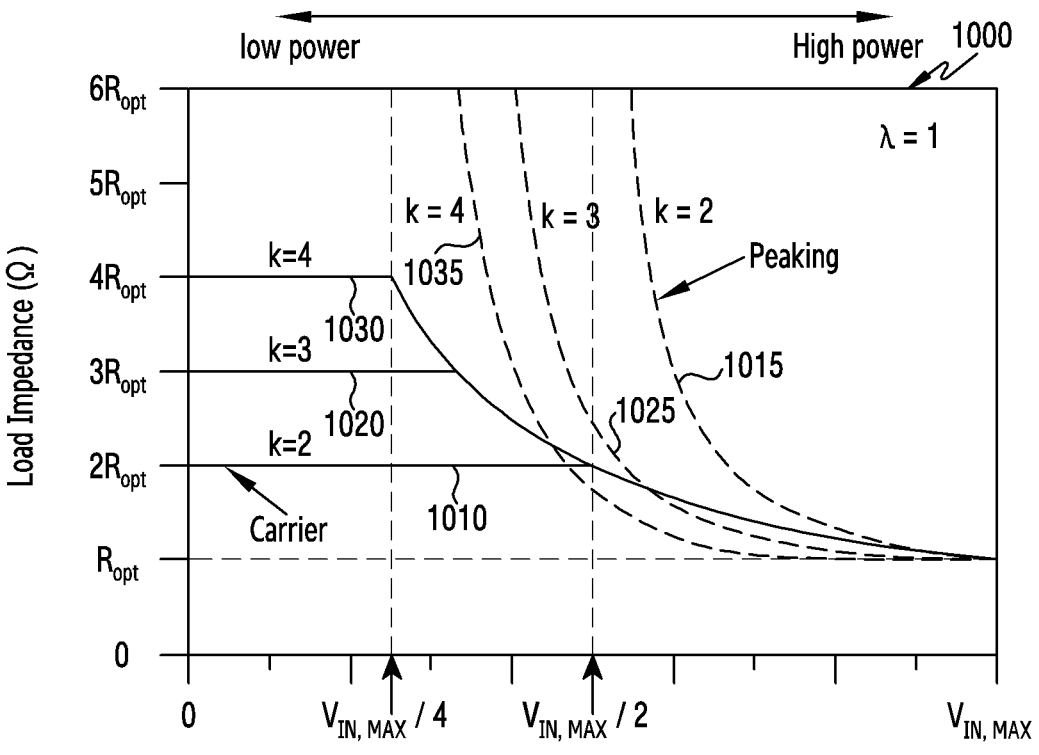
FIG. 10A is a graph illustrating examples of load impedances of a power amplifier according to an input voltage according to an embodiment of the disclosure.

FIG. 10A is a graph illustrating examples of a load impedance of a power amplifier according to an input voltage according to an embodiment of the disclosure. The graph in FIG. 10A indicates a load impedance according to a level of a voltage applied to an input end of each amplifier (e.g., the first power amplifier 410 and the second power amplifier 420 of the Doherty power amplifier 400 of FIG. 4 or the first power amplifier 810 and the second power amplifier 820 of the Doherty power amplifier 800 of FIG. 8). For convenience of explanation, it is assumed that the first power amplifier (or a main amplifier, a carrier amplifier) and the second power amplifier (or a sub amplifier, a peaking amplifier) of the Doherty power amplifier are symmetric ($\lambda=1$).

Referring to FIG. 10A, the graph 1000 includes solid lines indicating load impedance values according to an input voltage to the first power amplifier (i.e., the carrier PA), and dashed lines indicating load impedance values according to an input voltage to the second power amplifier (peaking PA). Specifically, the graph 1000 may show a first line 1010 illustrating a case where k (a modulation factor of a load impedance of an amplifier) is 2, a second line 1020 illustrating a case where k is 3, a third line 1030 illustrating a case where k is 4. The graph 1000 may show a fourth line 1015 illustrating a case where k is 2, a fifth line 1025 illustrating a case where k is 3, a sixth line 1035 illustrating a case where k is 4. The horizontal axis of the graph 1000 may indicate a level of a voltage (unit: V) of the input end of the amplifier, and the vertical axis may indicate a load impedance (unit: $\Omega$).

Referring to the first line 1010, when the input voltage level of the first power amplifier is a maximum ($V_{IN, \, MAX}$), the load impedance may be about $R_{opt}$. In addition, as the level of the input voltage of the first power amplifier gradually decreases, the load impedance may converge to about $2R_{opt}$. In this case, at the time when the load impedance starts to converge, the level of the input voltage of the first power amplifier may be about $V_{IN,MAX}/2$. On the other hand, referring to the fourth line 1015, when the input voltage level of the second power amplifier is the maximum ($V_{IN, \, MAX}$), the load impedance may be about $R_{opt}$, which is similar to that of the first power amplifier. However, as the level of the input voltage of the second power amplifier gradually decreases, the load impedance may converge to infinity ($\infty$). That is, comparing the first line 1010 and the fourth line 1015, both the first power amplifier and the second power amplifier of the Doherty power amplifier may have the load impedance of about $R_{opt}$ when the Doherty power amplifier according to embodiments of the disclosure is in the second state (i.e., the HP state). In addition, when the Doherty power amplifier according to embodiments of the disclosure is in the first state (i.e., the LP state), the first power amplifier of the Doherty power amplifier may have the load impedance of about $2R_{opt}$, and the second power amplifier may have the load impedance of infinity ($\infty$).

Referring to the second line 1020, when the input voltage level of the first power amplifier is the maximum ($V_{IN, \, MAX}$), the load impedance may be about $R_{opt}$. In addition, as the level of the input voltage of the first power amplifier gradually decreases, the load impedance may converge to about $3R_{opt}$. In this case, at the time when the load impedance starts to converge, the level of the input voltage of the first power amplifier may be a value between about $V_{IN, \, MAX}/2$ and about $V_{IN,MAX}/4$. On the other hand, referring to the fifth line 1025, when the input voltage level of the second power amplifier is the maximum ($V_{IN, \, MAX}$), the load impedance may be about $R_{opt}$, which is similar to that of the first power amplifier. However, as the level of the input voltage of the second power amplifier gradually decreases, the load impedance may converge to infinity ($\infty$). That is, comparing the second line 1020 and the fifth line 1025, both the first power amplifier and the second power amplifier of the Doherty power amplifier may have the load impedance of about $R_{opt}$ when the Doherty power amplifier according to embodiments of the disclosure is in the second state (i.e., the HP state). In addition, when the Doherty power amplifier according to embodiments of the disclosure is in the first state (i.e., the LP state), the first power amplifier of the Doherty power amplifier may have the load impedance of about $3R_{opt}$, and the second power amplifier may have the load impedance of infinity ($\infty$).

Referring to the third line 1030, when the input voltage level of the first power amplifier is the maximum ($V_{IN, \, MAX}$), the load impedance may be about $R_{opt}$. In addition, as the level of the input voltage of the first power amplifier gradually decreases, the load impedance may converge to about $4R_{opt}$. In this case, at the time when the load impedance starts to converge, the level of the input voltage of the first power amplifier may be about $V_{IN,MAX}/4$. On the other hand, referring to the sixth line 1035, when the input voltage level of the second power amplifier is the maximum ($V_{IN, \, MAX}$), the load impedance may be about $R_{opt}$, which is similar to that of the first power amplifier. However, as the level of the input voltage of the second power amplifier gradually decreases, the load impedance may converge to infinity ($\infty$). That is, comparing the third line 1030 and the sixth line 1035, both the first power amplifier and the second power amplifier of the Doherty power amplifier may have the load impedance of about $R_{opt}$ when the Doherty power amplifier according to embodiments of the disclosure is in the second state (i.e., the HP state). In addition, when the Doherty power amplifier according to embodiments of the disclosure is in the first state (i.e., the LP state), the first power amplifier of the Doherty power amplifier may have the load impedance of about $4R_{opt}$, and the second power amplifier may have the load impedance of infinity ($\infty$).

Figure 10B:
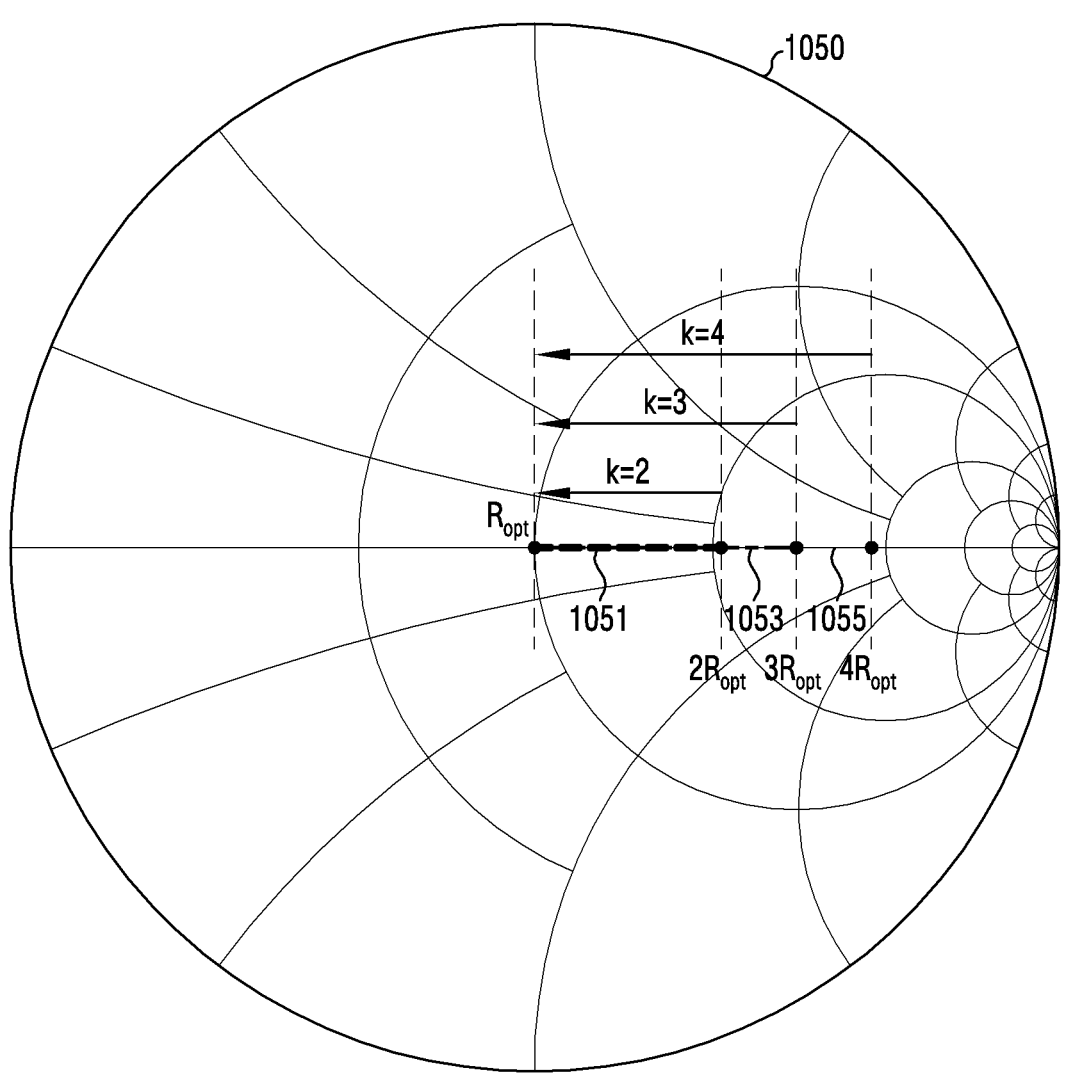
FIG. 10B is a graph illustrating an example of a change in a load impedance of a first power amplifier according to an input voltage according to an embodiment of the disclosure.

FIG. 10B is a graph illustrating an example of a change in the load impedance of a first power amplifier according to an input voltage according to an embodiment of the disclosure.

Referring to FIG. 10B, in the graph 1050, a first line 1051 indicating a change in the load impedance if a modulation factor (k) on the load impedance of the amplifier is 2, a second line 1053 indicating a change in the load impedance if k is 3, a third line 1055 indicating a change in the load impedance if k is 4 are illustrated. Referring to the first line 1051, the load impedance of the amplifier may be a value between $2R_{opt}$ and $R_{opt}$. Referring to the second line 1053, the load impedance of the amplifier may be a value between $3R_{opt}$ and $R_{opt}$. Referring to the third line 1055, the load impedance of the amplifier may be a value between $4R_{opt}$ and $R_{opt}$. In other words, referring to the first line 1051 to the third line 1055, the range of the load impedance may be determined according to k.

Figure 10C:
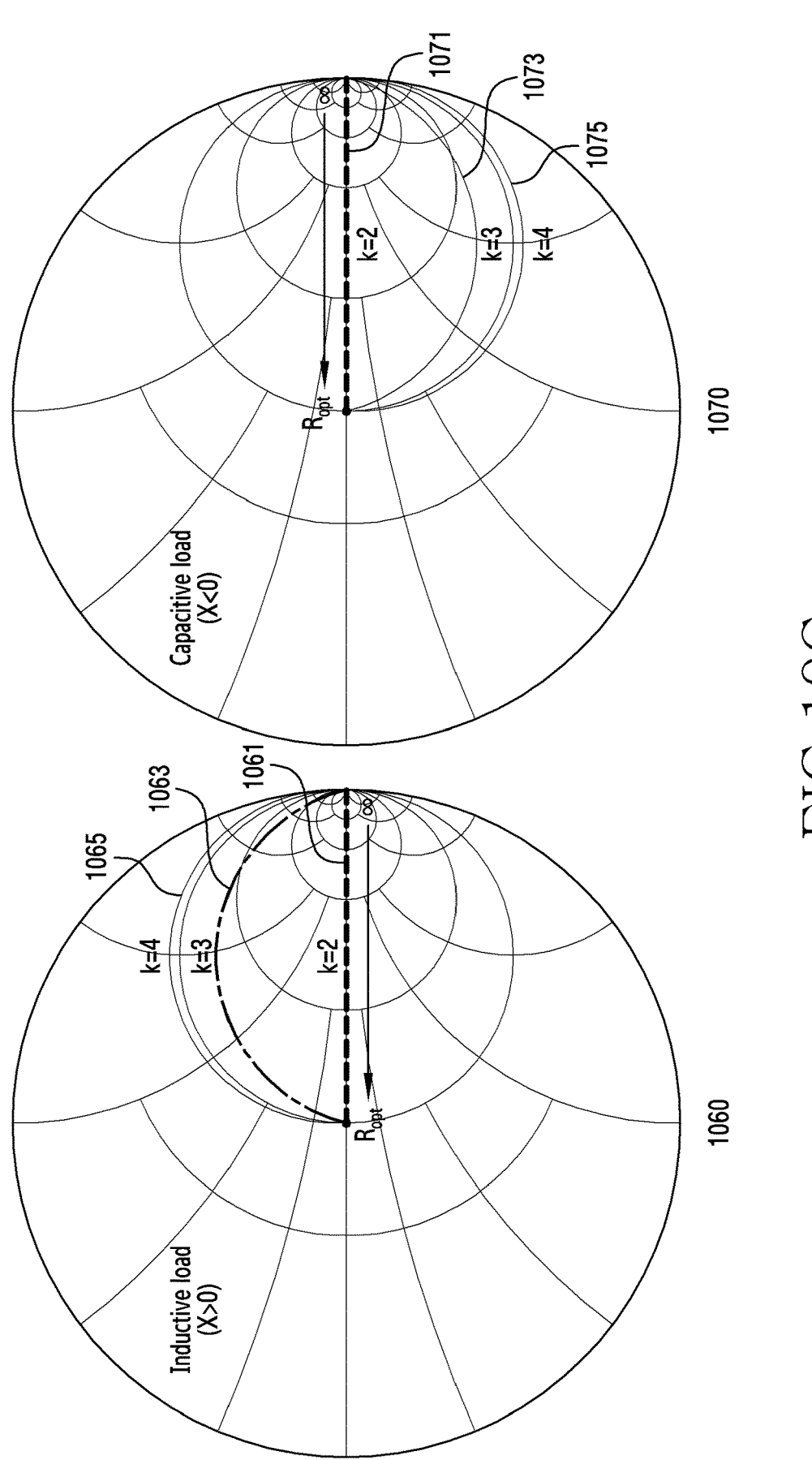
FIG. 10C is a graph illustrating an example of a change in a load impedance of a second power amplifier according to an input voltage according to an embodiment of the disclosure.

FIG. 10C is a graph illustrating an example of a change in the load impedance of the second power amplifier according to an input voltage according to an embodiment of the disclosure.

Referring to FIG. 10C, the graph 1060 shows a case where the modulation impedance is inductive, and a first line 1061 indicating a change in the load impedance if the modulation factor (k) on the load impedance of the amplifier is 2, a second line 1063 indicating a change in the load impedance if k is 3, a third line 1065 indicating a change in the load impedance if k is 4 are illustrated. Referring to the first line 1061, the load impedance of the amplifier may be a value between $\infty$ and $R_{opt}$. The first line 1061 may be formed in a linear shape, indicating that a phase value is fixed to 0. Referring to the second line 1063, the load impedance of the amplifier may be a value between $\infty$ and $R_{opt}$. The second line 1063 may be formed in a curved shape, indicating that a phase value is changeable. Referring to the third line 1065, the load impedance of the amplifier may be a value between $\infty$ and $R_{opt}$. The third line 1065 may be formed in a curved shape, indicating that a phase value is changeable, and a change rate of the phase value of the third line 1065 may be greater than that of the second line 1063. In addition, referring to the second line 1063 and the third line 1065, the load impedance of the amplifier (i.e., the second power amplifier) may have a positive phase value since the modulation impedance is inductive.

The graph 1070 shows a case where the modulation impedance is capacitive, and a fourth line 1071 indicating a change in the load impedance if the modulation factor (k) on the load impedance of the amplifier is 2, a fifth line 1073 indicating a change in the load impedance if k is 3, a sixth line 1075 indicating a change in the load impedance if k is 4 are illustrated. Referring to the fourth line 1071, the load impedance of the amplifier may be a value between $\infty$ and $R_{opt}$. The fourth line 1071 may be formed in a linear shape, indicating that a phase value is fixed to 0. Referring to the fifth line 1073, the load impedance of the amplifier may be a value between $\infty$ and $R_{opt}$. The fifth line 1073 may be formed in a curved shape, indicating that a phase value is changeable. Referring to the sixth line 1075, the load impedance of the amplifier may be a value between $\infty$ and $R_{opt}$. The sixth line 1075 may be formed in a curved shape, indicating that a phase value is changeable, and a change rate of the phase value of the sixth line 1075 may be greater than that of the fifth line 1073. In addition, referring to the fifth line 1073 and the sixth line 1075, the load impedance of the amplifier (i.e., the second power amplifier) may have a negative phase value since the modulation impedance is capacitive.

As described above, in the case of the Doherty power amplifier to which the modulation impedance is coupled according to embodiments of the disclosure, the modulation factor on the load impedance of the amplifier may be adjusted, and accordingly, the value of the load impedance may be adjusted. Specifically, when the Doherty power amplifier is in the first state, the modulation factor on the load impedance of the amplifier may be adjusted, and accordingly, a value that the load impedance of the first power amplifier converges to by the modulation factor may be determined. Accordingly, the load impedance of the amplifier may be modulated by adjusting the modulation impedance connected to one port of the coupler as described in FIGS. 9A and 9B. In addition, the load impedance of the amplifier being modulated indicates that the modulation factor may be adjusted and a value of a back-off power may be adjusted. Hereinafter, a change in power added efficiency (PAE) according to a change in the modulation factor will be described with reference to FIG. 11.

Figure 11:
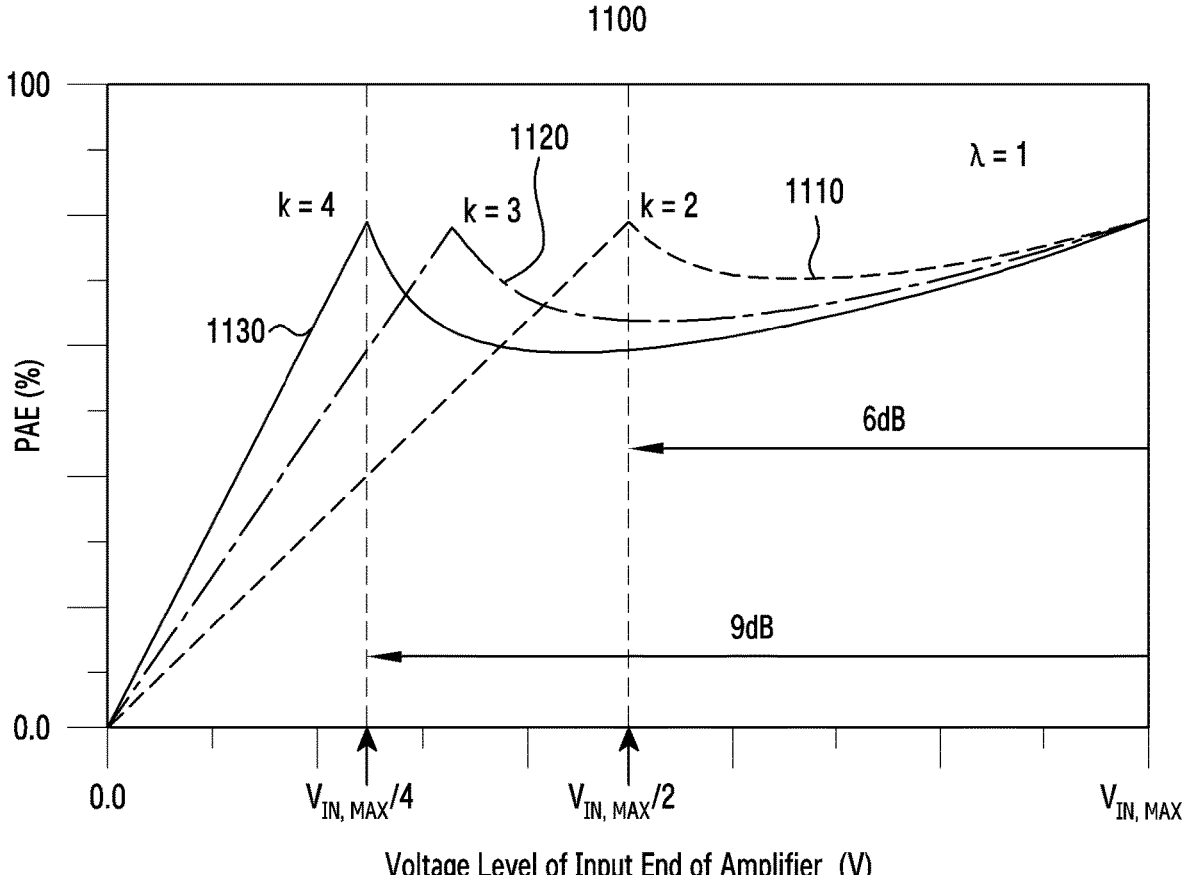
FIG. 11 is a graph illustrating an example of power added efficiency (PAE) according to an input voltage of a Doherty power amplifier including a coupler according to an embodiment of the disclosure.

FIG. 11 is a graph illustrating an example of power added efficiency (PAE) changing according to an input voltage of a Doherty power amplifier including a coupler according to an embodiment of the disclosure. The Doherty power amplifier including the coupler may refer to a structure in which a modulation impedance (i.e., a reactance element) is connected to one port of the coupler. For convenience of explanation, it is assumed that a first power amplifier and a second power amplifier of the Doherty power amplifier are symmetric ($\lambda$=1). The horizontal axis of the graph 1100 may indicate a level of a voltage of an input end of the amplifier (unit: V), and the vertical axis may indicate power added efficiency (PAE) (unit: %).

Referring to FIG. 11, in the graph 1100, a first line 1110 indicating a change in PAE if a modulation factor (k) on a load impedance of the amplifier is 2, a second line 1120 indicating a change in PAE if k is 3, a third line 1130 indicating a change in PAE if k is 4 are illustrated. Referring to the first line 1110, when the level of the input voltage of an amplification end is a maximum ($V_{IN, MAX}$) (i.e., an output of the amplifier is the maximum), PAE may be about 80%. In addition, when the level of the input voltage of the amplification end is about $V_{IN, MAX}/2$, PAE may be about 80%, which is similar to that when the level of the input voltage is the maximum. This means that, if k=2, a back-off power of the amplifier is about 6 dB. Referring to the second line 1120, when the level of the input voltage of the amplification end is the maximum ($V_{IN, MAX}$) (i.e., the output of the amplifier is the maximum), PAE may be about 80%. In addition, when the level of the input voltage of the amplification end is a value between about $V_{IN,MAX}/2$ and about $V_{IN,MAX}/4$, PAE may be about 80%, which is similar to that when the level of the input voltage is the maximum. This means that, if k=3, the back-off power of the amplifier may be about 8 dB. Referring to the third line 1130, when the level of the input voltage of the amplification end is the maximum ($V_{IN, MAX}$) (i.e., the output of the amplifier is the maximum), PAE may be about 80%. In addition, when the level of the input voltage of the amplification end is about $V_{IN,MAX}/4$, PAE may be about 80%, which is similar to that when the level of the input voltage is the maximum. This means that, if k=4, the back-off power of the amplifier may be about 9 dB.

As described above, in the case of the Doherty power amplifier to which the modulation impedance is coupled according to embodiments of the disclosure, the modulation factor on the load impedance of the amplifier may be adjusted, and accordingly, the value of the load impedance may be adjusted. Specifically, when the Doherty power amplifier is in the first state, the modulation factor on the load impedance of the amplifier may be adjusted, and accordingly, a value that the load impedance of the first power amplifier converges to by the modulation factor may be determined. Accordingly, the load impedance of the amplifier may be modulated by adjusting the modulation impedance connected to one port of the coupler as described in FIGS. 9A and 9B. In addition, the load impedance of the amplifier being modulated indicates that the modulation factor may be adjusted and a value of the back-off power may be adjusted.

The Doherty power amplifier to which the modulation impedance is coupled according to embodiments of the disclosure may have an enlarged back-off area, compared to a related-art amplifier structure (e.g., Class-AB, a Doherty power amplifier, the power amplifier including the coupler of FIG. 2B). Specifically, the modulation impedance may be connected to one port of the coupler (e.g., the third port (coupled end)), and a matching network may be disposed between another port (e.g., the first port (input end)) of the coupler and a first power amplifier (or a main amplifier, a carrier amplifier), and the structure of the Doherty power amplifier according to embodiments of the disclosure may adjust a back-off power by adjusting values of the modulation impedance and the matching network. Through this, the Doherty power amplifier structure according to embodiments of the disclosure may ensure a back-off area (e.g., about 9 dB) which is more enlarged than an existing back-off area (e.g., about 6 dB). Since the back-off area is enlarged, the Doherty power amplifier structure according to embodiments of the disclosure may be used for a signal of a modulation scheme having a high PAPR according to development of wireless communication systems, and may minimize power consumption. Though this, an electronic device (e.g., a base station, a terminal, etc.) including the Doherty power amplifier structure according to embodiments of the disclosure may minimize power consumption, may reduce heat emission, and may increase a life of a battery.

Figure 12:
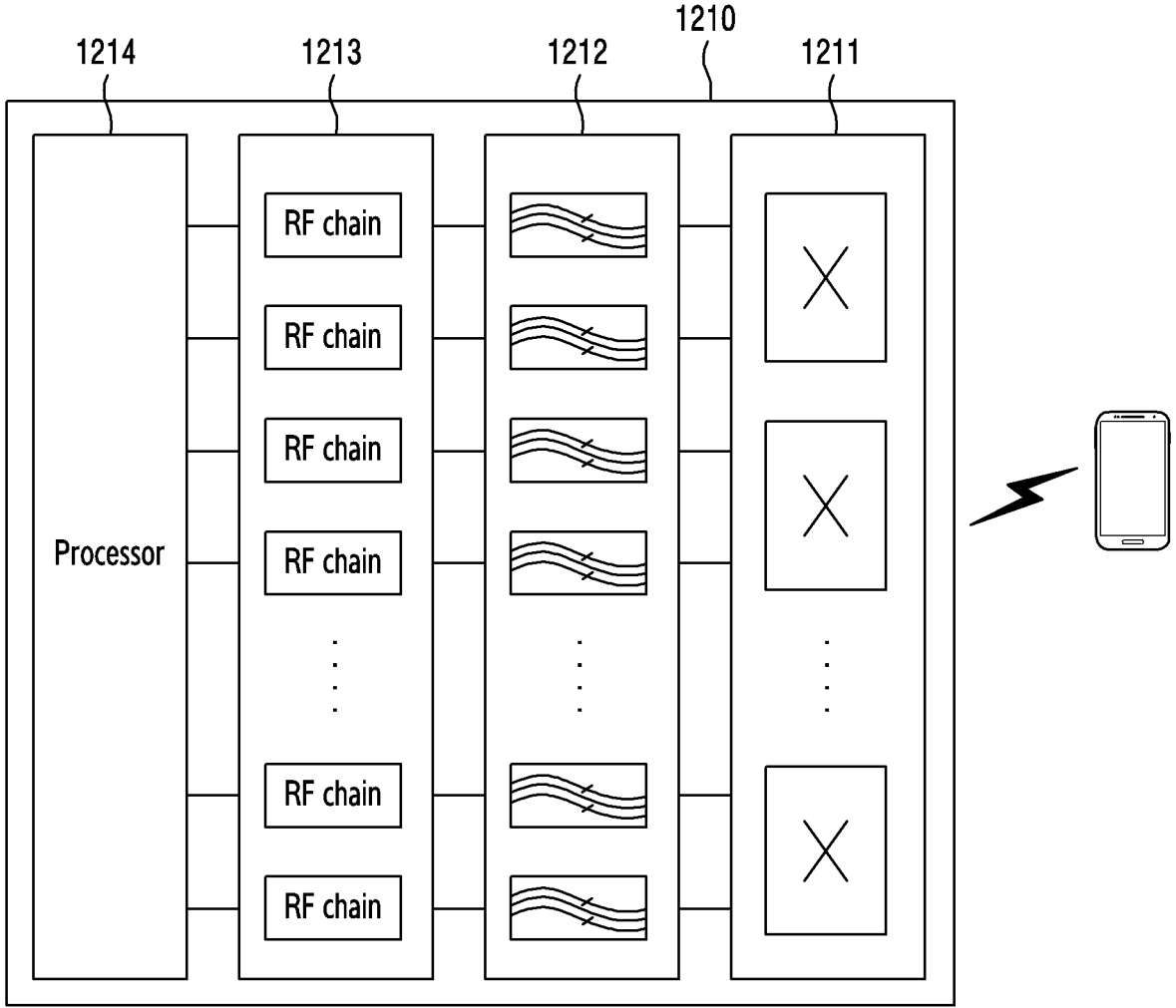
FIG. 12 is a view illustrating a functional configuration of an electronic device according to an embodiment of the disclosure.

FIG. 12 illustrates a functional configuration of an electronic device according to an embodiment of the disclosure.

The electronic device 1210 may be one of a base station or a terminal. According to an embodiment, the electronic device 1210 may be an MMU or mmWave device.

Referring to FIG. 12, a functional configuration of the electronic device 1210 is illustrated. The electronic device 1210 may include an antenna unit 1211, a filter unit 1212, a radio frequency (RF) processor 1213, and a controller 1214.

The antenna unit 1211 may include a plurality of antennas. The antenna may perform functions for transmitting and receiving signals through a wireless channel. The antenna may include a conductor formed on a substrate (e.g., a printed circuit board (PCB)), or a radiator formed of a conductive pattern. The antenna may radiate an up-converted signal on a wireless channel or may acquire a signal radiated by another device. Each antenna may be referred to as an antenna element. In some embodiments, the antenna unit 1211 may include an antenna array (e.g., a sub array) which forms an array with a plurality of antenna elements. The antenna unit 1211 may be electrically connected with the filter unit 1212 through RF signal lines. The antenna unit 1211 may be mounted on a PCB which includes a plurality of antenna elements. The PCB may include a plurality of RF signal lines connecting the antenna elements and filters of the filter unit 1212. The RF signal lines may be referred to as a feeding network. The antenna unit 1211 may provide a received signal to the filter unit 1212, or may radiate a signal provided from the filter unit 1212 to air.

The antenna unit 1211 according to various embodiments may include at least one antenna module having a dual polarization antenna. The dual polarization antenna may be, for example, a cross-polarization (X-pol) antenna. The dual polarization antenna may include two antenna elements corresponding to different polarizations. For example, the dual polarization antenna may include a first antenna element having a polarization of +45° and a second antenna element having a polarization of −45°. The polarization may include other orthogonal polarizations in addition to +45°, −45°. Each antenna element may be connected with a feeding line, and may be electrically connected with the filter unit 1212, the RF processor 1213, and the controller 1214, which will be described below.

According to an embodiment, the dual polarization antenna may be a patch antenna (or a microstrip antenna). The dual polarization antenna has a form of a patch antenna, so that the dual polarization antenna may be easily implemented and integrated into an array antenna. Two signals having different polarizations may be inputted to respective antenna ports. Each antenna port corresponds to an antenna element. A relationship with a co-pol characteristic and a cross-pol characteristic between the two signals having different polarizations is required to be optimized. In the dual polarization antenna, the co-pol characteristic indicates a characteristic regarding a specific polarization component, and the cross-pol characteristic indicates a characteristic regarding a polarization component different from the specific polarization component.

The filter unit 1212 may perform filtering to transmit a signal of a desired frequency. The filter unit 1212 forms a resonance, thereby performing a function of selectively identifying a frequency. In some embodiments, the filter unit 1212 may structurally form the resonance through a cavity including a dielectric. In addition, in some embodiments, the filter unit 1212 may form the resonance through elements forming an inductance or a capacitance. In addition, in some embodiments, the filter unit 1212 may include an elastic filter such as a bulk acoustic wave (BAW) filter or a surface acoustic wave (SAW) filter. The filter unit 1212 may include at least one of a band pass filter, a low pass filter, a high pass filter, or a band reject filter. That is, the filter unit 1212 may include RF circuits to acquire a signal of a frequency band for transmitting or a signal of a frequency band for receiving. The filter unit 1212 according to various embodiments may electrically connect the antenna unit 1211 and the RF processor 1213.

The RF processor 1213 may include a plurality of RF paths. The RF path may be a unit of a path through which a signal received through an antenna or a signal radiated through an antenna passes. At least one RF path may be referred to as an RF chain. The RF chain may include a plurality of RF elements. The RF elements may include an amplifier, a mixer, an oscillator, a digital-to-analogue converter (DAC), an analogue-to-digital converter (ADC). For example, the RF processor 1213 may include an up converter to up-convert a digital transmission signal of a baseband into a transmission frequency, and a digital-to-analog converter (DAC) to convert an up-converted digital transmission signal into an analogue RF transmission signal. The up converter and the DAC may form a part of a transmission path. The transmission path may further include a power amplifier (PA) or a coupler (or a combiner). For example, the RF processor 1213 may include an analogue-to-digital converter (ADC) to convert an analogue RF reception signal into a digital reception signal, and a down converter to convert a digital reception signal into a digital reception signal of a baseband. The ADC and the down converter may form a part of a reception path. The reception path may further include a low noise amplifier (LNA) or a coupler (or a divider). RF components of the RF processor may be implemented on a PCB. The electronic device 1210 may include a structure in which the antenna unit 1211, the filter unit 1212, the RF processor 1213 are layered in order of mention. The antennas and the RF components of the RF processor may be implemented on a PCB, and filters are repeatedly secured between the PCBs, thereby forming a plurality of layers. The Doherty power amplifier to which the modulation impedance is coupled according to embodiments of the disclosure may be included in the RF processor 1213 of FIG. 12.

The controller 1214 may control overall operations of the electronic device 1210. The controller 1214 may include various modules for performing communication. The controller 1214 may include at least one processor like a modem. The controller 1214 may include modules for digital signal processing. For example, the controller 1214 may include a modem. When transmitting data, the controller 1214 generates complex symbols by encoding and modulating a transmission bit stream. For example, when receiving data, the controller 1214 restores a reception bit stream by demodulating and decoding a baseband signal. The controller 1214 may perform functions of a protocol stack required by communication standards.

FIG. 12 illustrates a functional configuration of the electronic device 1210 as equipment utilizing the structure of the amplifier of the disclosure. However, the example illustrated in FIG. 12 is merely a configuration for utilizing the Doherty power amplifier structure according to embodiments of the disclosure described through FIGS. 1 to 11, and an electronic device including the same, and embodiments of the disclosure are not limited to the components of the equipment shown in FIG. 12. Accordingly, the structure of the Doherty power amplifier according to embodiments of the disclosure, the electronic device including the Doherty power amplifier structure, and communication equipment of other configurations including the same may also be understood as embodiments of the disclosure.

As described above, according to an embodiment of the disclosure, a Doherty power amplifier of a wireless communication system, the Doherty power may include a first power amplifier, a second power amplifier, a first transmission line, a 4-port coupler, and a load impedance, and the 4-port coupler may include a first port, a second port, a third port, and a fourth port, the first power amplifier may be coupled with the 4-port coupler through the first port, the second power amplifier may be coupled with the 4-port coupler through the fourth port, the load impedance may be coupled with the 4-port coupler through the third port, the first transmission line may be disposed between the first power amplifier and the first port of the 4-port coupler, and the second port may be an output end of the power amplifier.

In an embodiment, the first power amplifier may be a Class-AB power amplifier, and the second power amplifier may be a Class-C power amplifier.

In an embodiment, the 4-port coupler may include at least one of a coupled line coupler, a lange coupler, a hybrid coupler, or a ring hybrid coupler.

In an embodiment, the 4-port coupler may include a lumped element.

In an embodiment, the Doherty power amplifier may further include a second transmission line connected with an input end of the second power amplifier.

In an embodiment, the second transmission line may have an electrical length determined based on a phase difference value between the first power amplifier and the second power amplifier.

In an embodiment, the load impedance may include at least one of a capacitor, an inductor, an open stub, or a short stub.

In an embodiment, when an impedance in a direction from an output end of the first power amplifier toward the first transmission line is referred to as a first impedance, the first impedance may be determined based on a reactance value of the load impedance and a characteristic of the first transmission line.

In an embodiment, the characteristic of the first transmission line may be determined based on a characteristic impedance and an electrical length of the first transmission line.

In an embodiment, an output voltage of the first power amplifier and an output voltage of the second power amplifier may be symmetric.

As described above, according to an embodiment of the disclosure, an electronic device of a wireless communication system may include at least one processor, a plurality of RF chains connected with the at least one processor, and a plurality of antenna elements connected with the plurality of RF chains, and a first RF chain of the plurality of RF chains may include a Doherty power amplifier, the Doherty power amplifier may include a first power amplifier, a second power amplifier, a first transmission line, a 4-port coupler, and a load impedance, the 4-port coupler may include a first port, a second port, a third port, and a fourth port, the first power amplifier may be coupled with the 4-port coupler through the first port, the second power amplifier may be coupled with the 4-port coupler through the fourth port, the load impedance may be coupled with the 4-port coupler through the third port, the first transmission line may be disposed between the first power amplifier and the first port of the 4-port coupler, the second port may be an output end of the power amplifier.

In an embodiment, the first power amplifier may be a Class-AB power amplifier, and the second power amplifier may be a Class-C power amplifier.

In an embodiment, the 4-port coupler may include at least one of a coupled line coupler, a lange coupler, a hybrid coupler, or a ring hybrid coupler.

In an embodiment, the 4-port coupler may include a lumped element.

In an embodiment, the Doherty power amplifier may further include a second transmission line connected with an input end of the second power amplifier.

In an embodiment, the second transmission line may have an electrical length determined based on a phase difference value between the first power amplifier and the second power amplifier.

In an embodiment, the load impedance may include at least one of a capacitor, an inductor, an open stub, or a short stub.

In an embodiment, when an impedance in a direction from an output end of the first power amplifier toward the first transmission line is referred to as a first impedance, the first impedance may be determined based on a reactance value of the load impedance and a characteristic of the first transmission line.

In an embodiment, the characteristic of the first transmission line may be determined based on a characteristic impedance and an electrical length of the first transmission line.

In an embodiment, an output voltage of the first power amplifier and an output voltage of the second power amplifier may be symmetric.

Methods based on the claims or the embodiments disclosed in the disclosure may be implemented in hardware, software, or a combination of both.

When implemented in software, a computer readable storage medium for storing one or more programs (software modules) may be provided. The one or more programs stored in the computer readable storage medium are configured for execution performed by one or more processors in an electronic device. The one or more programs include instructions for allowing the electronic device to execute the methods based on the claims or the embodiments disclosed in the disclosure.

The program (the software module or software) may be stored in a random access memory, a non-volatile memory including a flash memory, a read only memory (ROM), an electrically erasable programmable read only memory (EE-PROM), a magnetic disc storage device, a compact disc-ROM (CD-ROM), digital versatile discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network such as the Internet, an Intranet, a local area network (LAN), a wide LAN (WLAN), or a storage area network (SAN) or a communication network configured by combining the networks. The storage device may access via an external port to a device which performs the embodiments of the disclosure. In addition, an additional storage device on a communication network may access to a device which performs the embodiments of the disclosure.

In the above-described specific embodiments of the disclosure, elements included in the disclosure are expressed in singular or plural forms according to specific embodiments. However, singular or plural forms are appropriately selected according to suggested situations for convenience of explanation, and the disclosure is not limited to a single element or plural elements. An element which is expressed in a plural form may be configured in a singular form or an element which is expressed in a singular form may be configured in plural number.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A Doherty power amplifier in a wireless communication system, the Doherty power amplifier comprising:
    a first power amplifier;
    a second power amplifier;
    a first transmission line;
    a 4-port coupler; and
    a load impedance for an impedance for the first power amplifier,
    wherein the 4-port coupler comprises a first port, a second port, a third port, and a fourth port,
    wherein the first power amplifier is coupled with the 4-port coupler through the first port,
    wherein the second power amplifier is coupled with the 4-port coupler through the fourth port,
    wherein the load impedance is coupled with the 4-port coupler through the third port,
    wherein the first transmission line electrically connects the first power amplifier and the first port of the 4-port coupler,
    wherein the second port is an output end of the Doherty power amplifier,
    wherein, in case that the first power amplifier operates and the second power amplifier does not operate, the impedance for the first power amplifier has a first value which is determined based on an impedance of the first transmission line and a designated modulation ratio of the impedance for the first power amplifier, and
    wherein, in case that the first power amplifier and the second power amplifier operate, the impedance for the first power amplifier has a second value which is determined based on the impedance of the first transmission line.

2. The Doherty power amplifier of claim 1,
    wherein the first power amplifier is a Class-AB power amplifier, and
    wherein the second power amplifier is a Class-C power amplifier.

3. The Doherty power amplifier of claim 1, wherein the 4-port coupler comprises at least one of:
    a coupled line coupler,
    a lange coupler,
    a hybrid coupler, or
    a ring hybrid coupler.

4. The Doherty power amplifier of claim 1, wherein the 4-port coupler comprises a lumped element.

5. The Doherty power amplifier of claim 1, further comprising a second transmission line connected with an input end of the second power amplifier.

6. The Doherty power amplifier of claim 5, wherein the second transmission line has an electrical length determined based on a phase difference value between the first power amplifier and the second power amplifier.

7. The Doherty power amplifier of claim 1, wherein the load impedance comprises at least one of:
    a capacitor,
    an inductor,
    an open stub, or
    a short stub.

8. The Doherty power amplifier of claim 1, wherein a back-off range of the Doherty power amplifier is determined based on the designated modulation ratio and a ratio of a current output by the second power amplifier to a current output by the first power amplifier.

9. The Doherty power amplifier of claim 1, wherein an output voltage of the first power amplifier and an output voltage of the second power amplifier are symmetric.

10. An electronic device in a wireless communication system, the electronic device comprising:
    at least one processor;
    a plurality of radio frequency (RF) chains connected with the at least one processor; and
    a plurality of antenna elements connected with the plurality of RF chains,
    wherein a first RF chain of the plurality of RF chains comprises a Doherty power amplifier,
    wherein the Doherty power amplifier comprises a first power amplifier, a second power amplifier, a first transmission line, a 4-port coupler, and a load impedance for an impedance for the first power amplifier,
    wherein the 4-port coupler comprises a first port, a second port, a third port, and a fourth port,
    wherein the first power amplifier is coupled with the 4-port coupler through the first port,
    wherein the second power amplifier is coupled with the 4-port coupler through the fourth port,
    wherein the load impedance is coupled with the 4-port coupler through the third port,
    wherein the first transmission line electrically connects the first power amplifier and the first port of the 4-port coupler,
    wherein the second port is an output end of the Doherty power amplifier,
    wherein, in case that the first power amplifier operates and the second power amplifier does not operate, the impedance for the first power amplifier has a first value which is determined based on an impedance of the first transmission line and a designated modulation ratio of the impedance for the first power amplifier, and
    wherein, in case that the first power amplifier and the second power amplifier operate, the impedance for the first power amplifier has a second value which is determined based on the impedance of the first transmission line.

11. The electronic device of claim 10,
    wherein the first power amplifier is a Class-AB power amplifier, and
    wherein the second power amplifier is a Class-C power amplifier.

12. The electronic device of claim 10, wherein the 4-port coupler comprises at least one of:
    a coupled line coupler,
    a lange coupler,
    a hybrid coupler, or
    a ring hybrid coupler.

13. The electronic device of claim 10, wherein the 4-port coupler comprises a lumped element.

14. The electronic device of claim 10, wherein the Doherty power amplifier further comprises a second transmission line connected with an input end of the second power amplifier.

15. The electronic device of claim 14, wherein the second transmission line has an electrical length determined based on a phase difference value between the first power amplifier and the second power amplifier.

16. The electronic device of claim 10, wherein the load impedance comprises at least one of:

a capacitor, an inductor, an open stub, or a short stub.

17. The electronic device of claim 16, wherein a back-off range of the Doherty power amplifier is determined based on the designated modulation ratio and a ratio of a current output by the second power amplifier to a current output by the first power amplifier.

18. The electronic device of claim 10, wherein an output voltage of the first power amplifier and an output voltage of the second power amplifier are symmetric.

\* \* \* \* \*